United States Patent
Aoki et al.

(10) Patent No.: US 8,459,561 B2
(45) Date of Patent: Jun. 11, 2013

(54) SEMICONDUCTOR DEVICE AND METHOD FOR MANUFACTURING THE SAME

(75) Inventors: Tomoyuki Aoki, Tochigi (JP); Takuya Tsurume, Kanagawa (JP); Hiroki Adachi, Tochigi (JP); Nozomi Horikoshi, Kanagawa (JP); Hisashi Ohtani, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 487 days.

(21) Appl. No.: 12/204,320

(22) Filed: Sep. 4, 2008

(65) Prior Publication Data

US 2009/0065590 A1    Mar. 12, 2009

(30) Foreign Application Priority Data

Sep. 7, 2007    (JP) ................. 2007-232713

(51) Int. Cl.
 *G06K 19/06*    (2006.01)
(52) U.S. Cl.
 USPC .......................................... 235/492; 428/416
(58) Field of Classification Search
 USPC ................................. 235/487, 492
 See application file for complete search history.

(56) References Cited

U.S. PATENT DOCUMENTS

| 5,972,739 | A | 10/1999 | Funada et al. |
| 6,224,965 | B1 | 5/2001 | Haas et al. |
| 6,403,221 | B1 * | 6/2002 | Nakamura et al. ............ 428/416 |
| 7,049,178 | B2 | 5/2006 | Kim et al. |
| 7,061,083 | B1 | 6/2006 | Usami et al. |
| 7,298,029 | B2 | 11/2007 | Usami et al. |
| 7,485,489 | B2 | 2/2009 | Björbell |
| 7,622,805 | B2 | 11/2009 | Usui et al. |
| 7,714,251 | B2 | 5/2010 | Miyairi |

(Continued)

FOREIGN PATENT DOCUMENTS

| CN | 1868062 | 11/2006 |
| CN | 1971849 | 5/2007 |

(Continued)

OTHER PUBLICATIONS

International Search Report (Applicant No. PCT/JP2008/065620) Dated Sep. 22, 2008.

(Continued)

*Primary Examiner* — Daniel Hess
(74) *Attorney, Agent, or Firm* — Eric J. Robinson; Robinson Intellectual Property Law Office, P.C.

(57) ABSTRACT

A separation layer and a semiconductor element layer including a thin film transistor are formed. A conductive resin electrically connected to the semiconductor element layer is formed. A first sealing layer including a fiber and an organic resin layer is formed over the semiconductor element layer and the conductive resin. A groove is formed in the first sealing layer, the semiconductor element layer, and the separation layer. A liquid is dropped into the groove to separate the separation layer and the semiconductor element layer. The first sealing layer over the conductive resin is removed to form an opening. A set of the first sealing layer and the semiconductor element layer is divided into a chip. The chip is bonded to an antenna formed over a base material. A second sealing layer including a fiber and an organic resin layer is formed so as to cover the antenna and the chip.

20 Claims, 25 Drawing Sheets

U.S. PATENT DOCUMENTS

| | | | |
|---|---|---|---|
| 2004/0209442 A1 | 10/2004 | Takakuwa et al. | |
| 2005/0134463 A1* | 6/2005 | Yamazaki | 340/572.8 |
| 2005/0194591 A1 | 9/2005 | Usami et al. | |
| 2005/0233122 A1 | 10/2005 | Nishimura et al. | |
| 2006/0063351 A1* | 3/2006 | Jain | 438/455 |
| 2007/0117287 A1 | 5/2007 | Miyairi | |
| 2007/0117288 A1* | 5/2007 | Miyairi | 438/151 |
| 2008/0012126 A1 | 1/2008 | Dozen et al. | |
| 2008/0032488 A1* | 2/2008 | Chu et al. | 438/462 |
| 2008/0054427 A1 | 3/2008 | Usami et al. | |
| 2010/0112760 A1 | 5/2010 | Usui et al. | |

FOREIGN PATENT DOCUMENTS

| | | |
|---|---|---|
| EP | 1092739 | 4/2001 |
| EP | 1589797 | 10/2005 |
| JP | 05-190582 | 7/1993 |
| JP | 08-306738 | 11/1996 |
| JP | 10-092980 | 4/1998 |
| JP | 2004-078991 | 3/2004 |
| JP | 2004-362341 | 12/2004 |
| JP | 2007-077179 | 3/2007 |
| JP | 2007-173782 | 7/2007 |
| WO | WO 01/01740 | 1/2001 |
| WO | WO 2004/001848 | 12/2003 |

OTHER PUBLICATIONS

Written Opinion (Applicant No. PCT/JP2008/065620) Dated Sep. 22, 2008.

Chinese Office Action (Application No. 200880025658.0) dated Mar. 16, 2011.

* cited by examiner

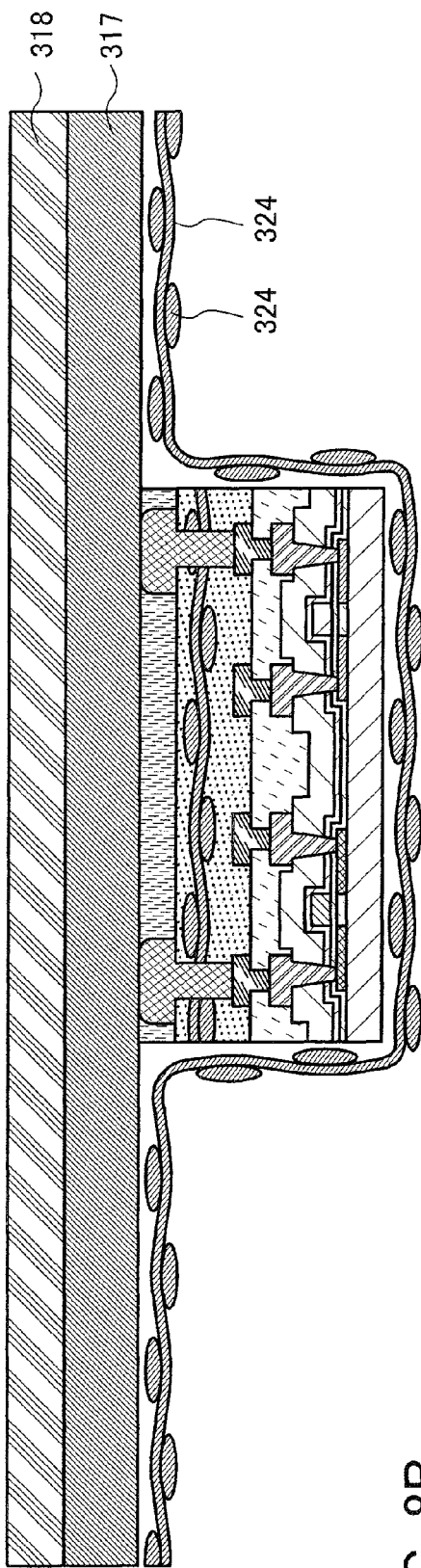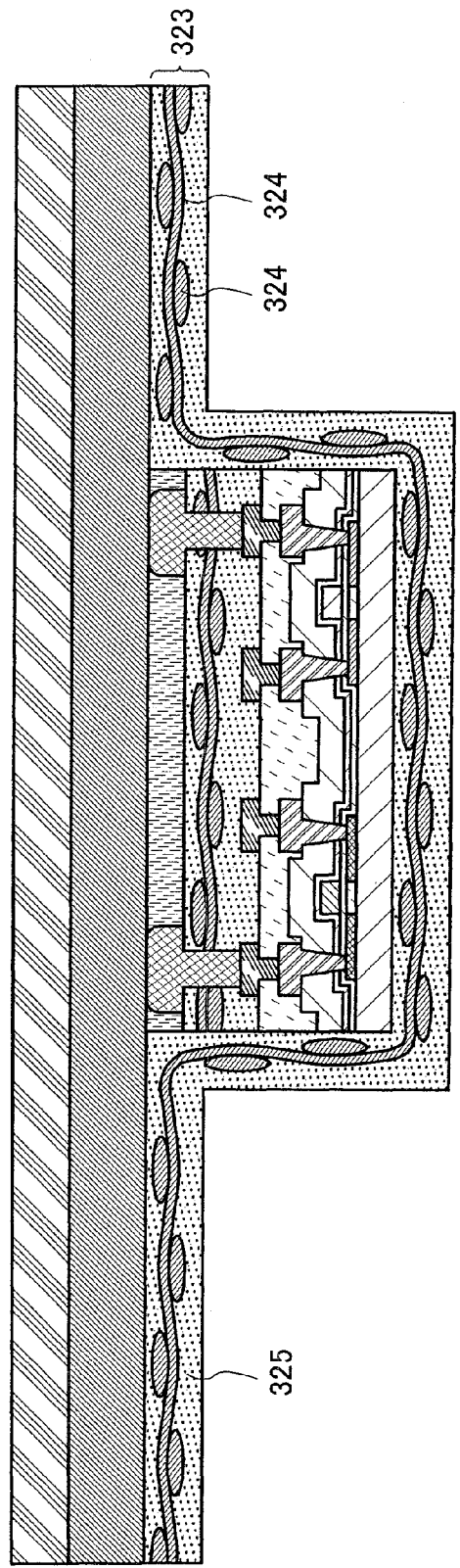

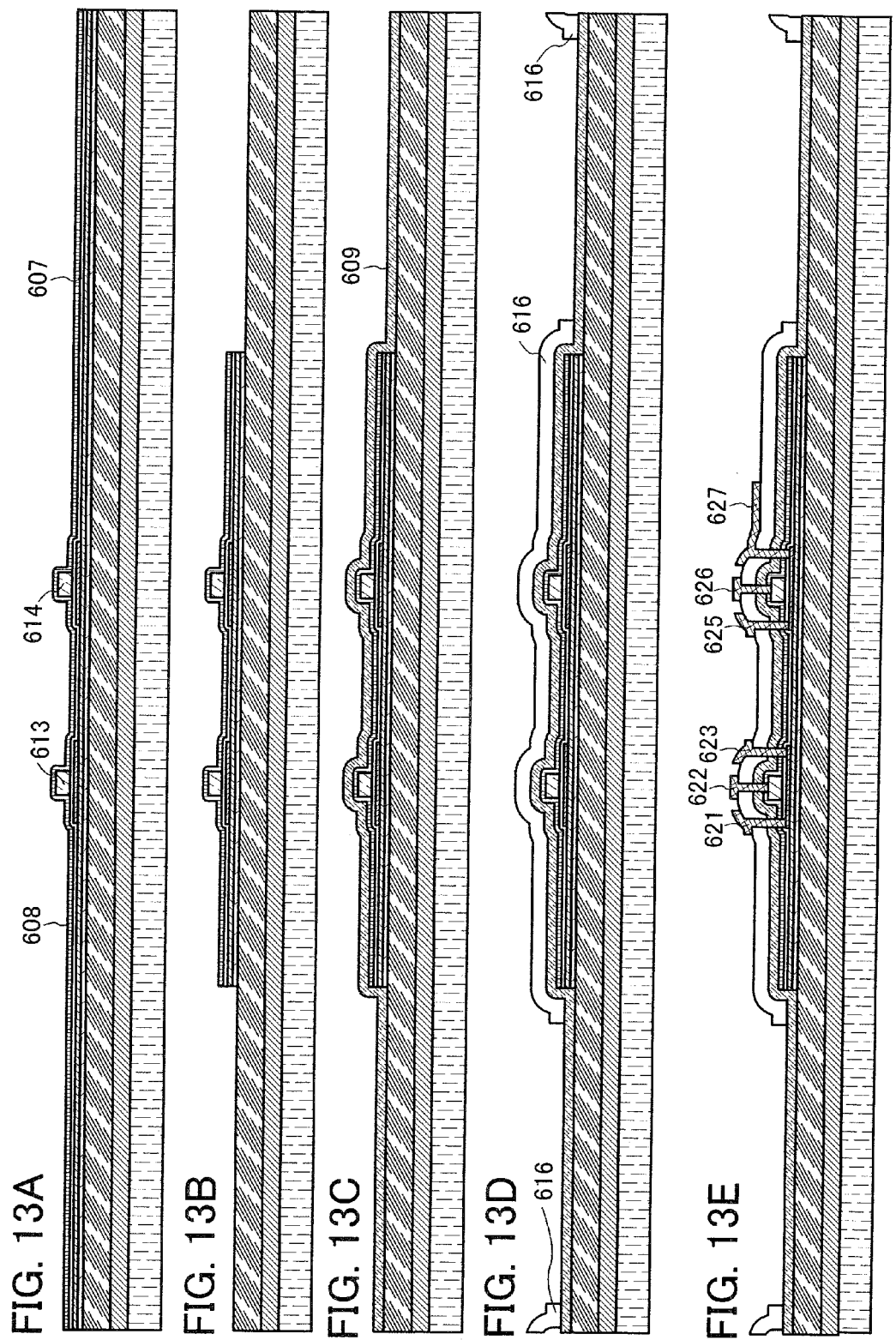

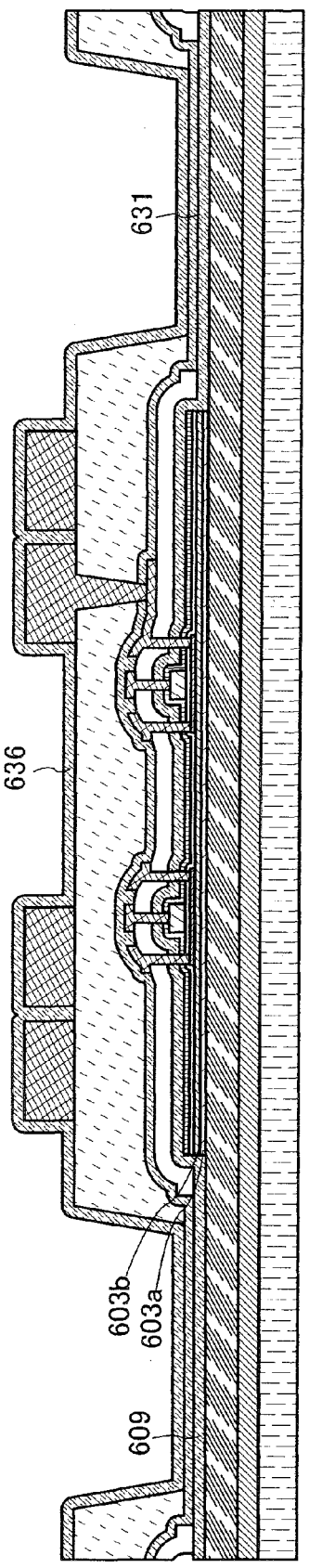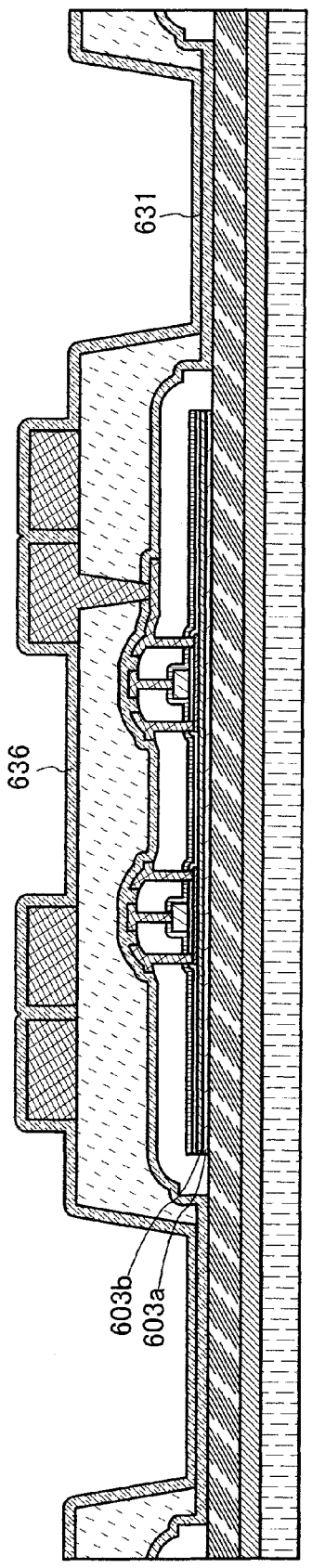
FIG. 15A
FIG. 15B

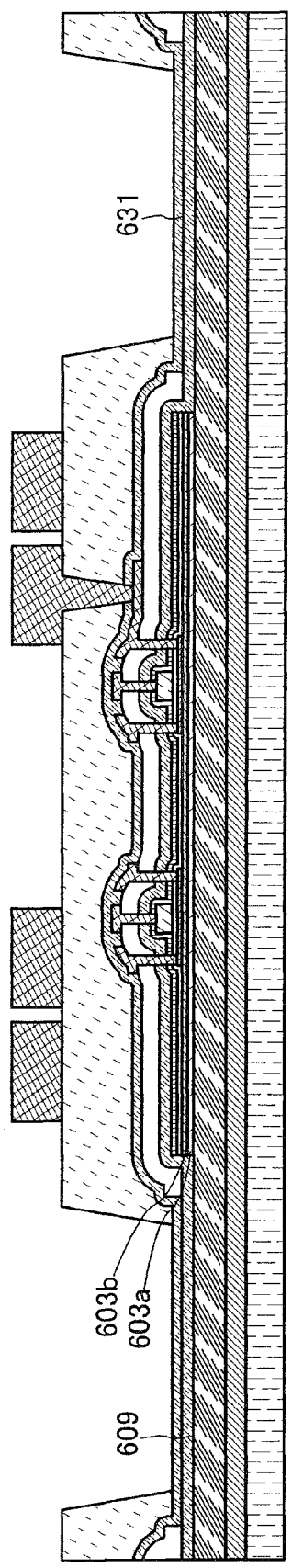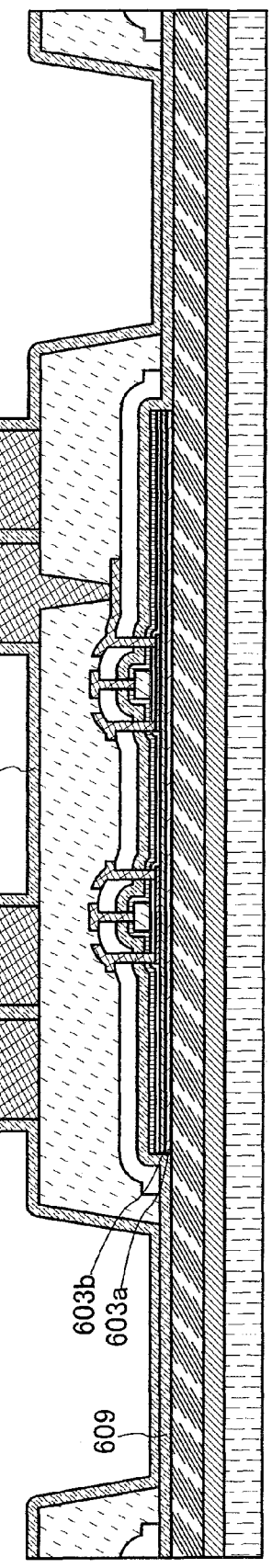

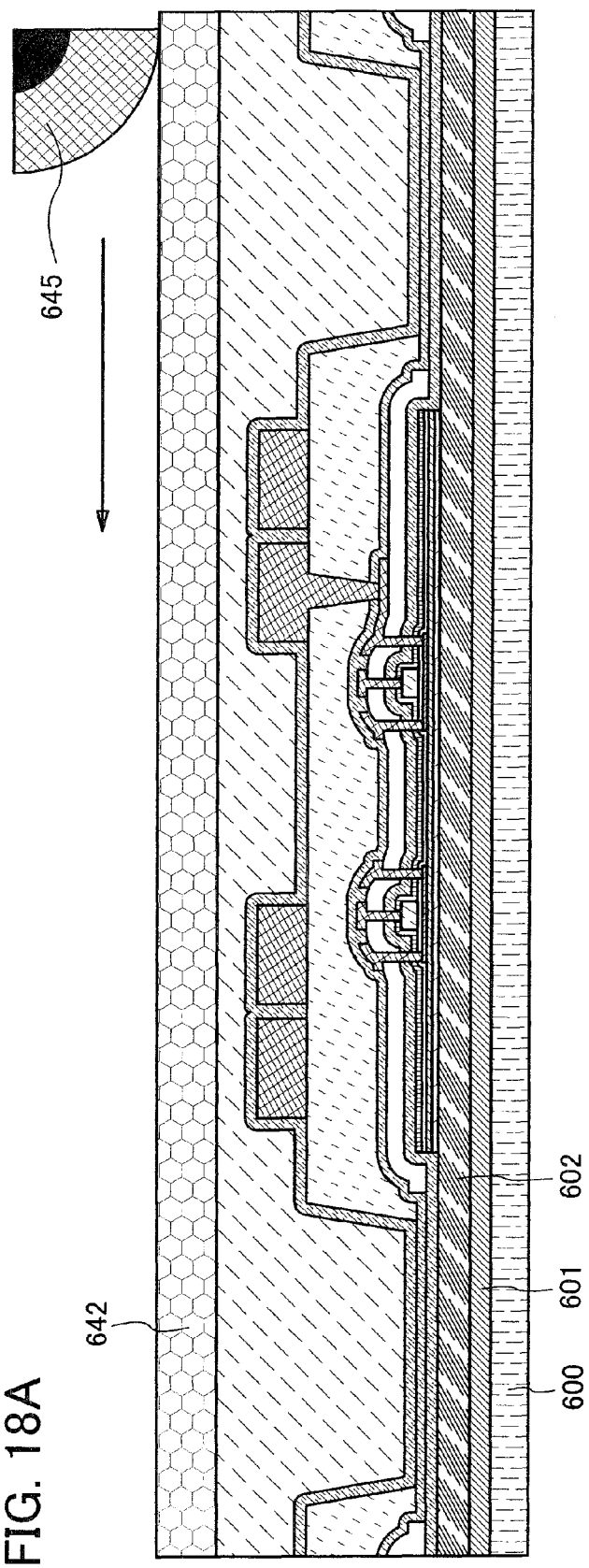
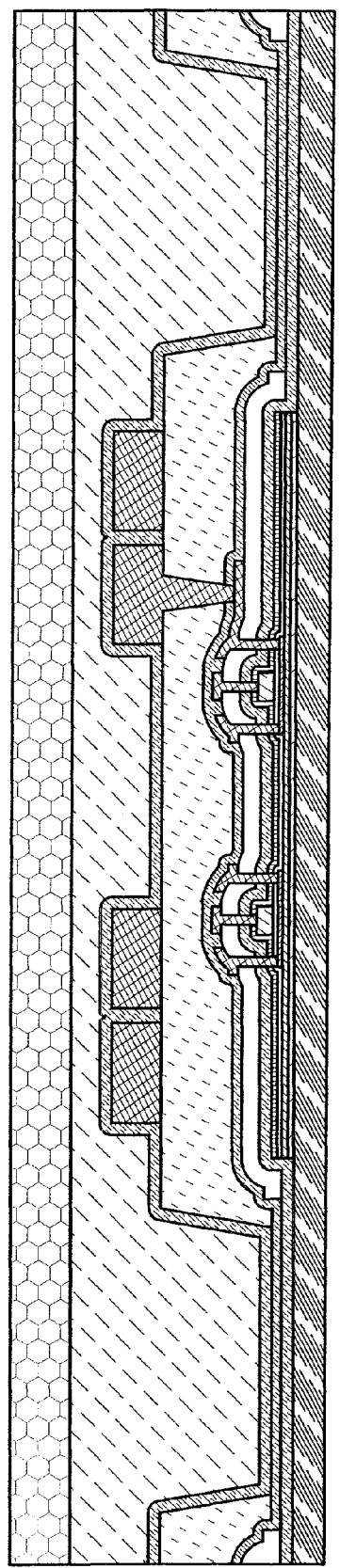
FIG. 18A
FIG. 18B

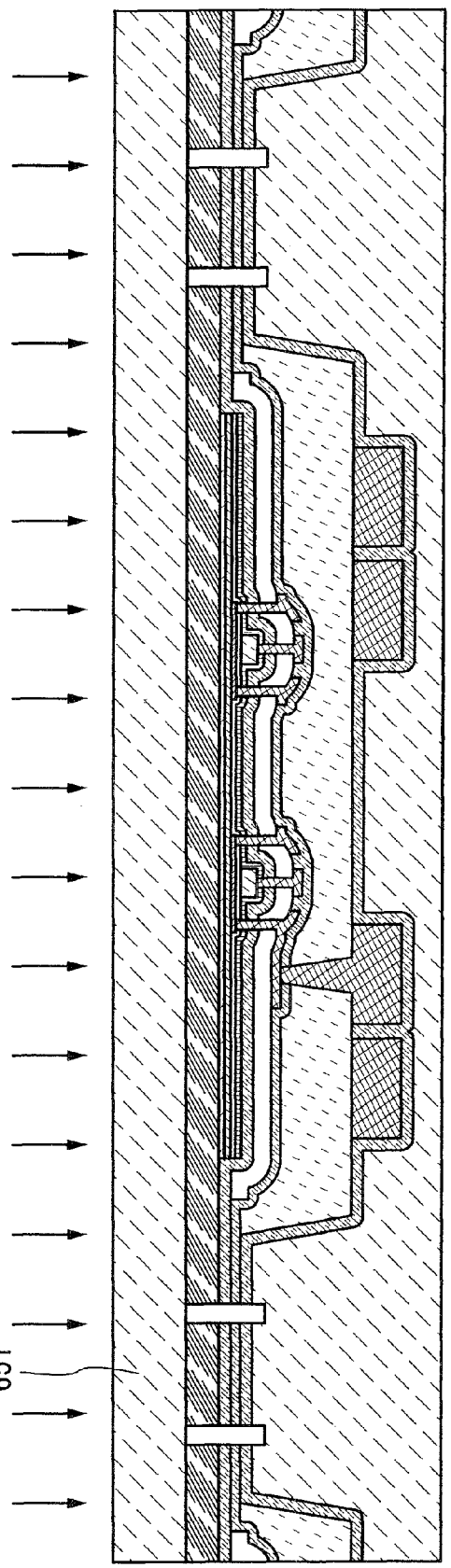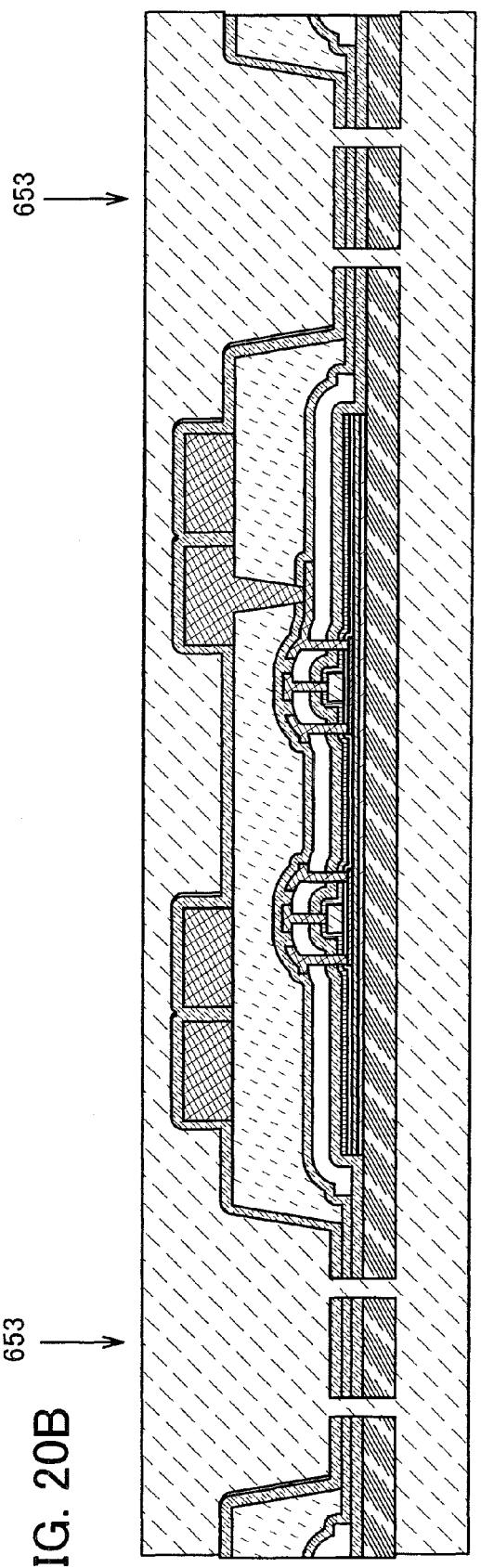

SEMICONDUCTOR DEVICE AND METHOD FOR MANUFACTURING THE SAME

TECHNICAL FIELD

The present invention relates to a semiconductor device and a manufacturing method thereof.

BACKGROUND ART

Currently, it is important to make a variety of devices such as wireless chips and sensors into a thinner shape in miniaturizing products, and the techniques and its application spread rapidly. Since such a variety of devices which are made thin are flexible to some extent, the devices can be mounted on an object having a curved surface.

A technique of manufacturing a semiconductor device is proposed, in which an element layer including a thin film transistor, which is formed on a glass substrate, is separated from the substrate and transferred to another base material, for example, a plastic film or the like.

For example, Patent Document 1 (Japanese Published Patent Application No. 2004-78991) discloses a semiconductor device in which a semiconductor chip with a size of 0.5 mm or less is embedded in paper or a film-like medium, whereby resistance to bending and concentrated load is improved.

DISCLOSURE OF INVENTION

However, in the case of a semiconductor device with a built-in (on-chip) antenna which is incorporated in a chip, the size of the antenna is small, and thus, a communication distance is shortened. Further, in the case where a semiconductor device is manufactured by connecting an antenna provided for paper or a film medium to a chip, a communication error occurs when the size of the chip is small.

Accordingly, it is preferable that the size of a chip itself be made larger in order to prevent a communication error or reduction in communication distance. However, when the area of the chip is enlarged, a semiconductor device which is transferred to a plastic film or the like is cracked by local pressing force from the outside, resulting in an operation error.

For example, when a character is written with a writing material on a plastic sheet or paper on a surface of a semiconductor device, writing pressure is applied to the semiconductor device, leading to a problem of destruction of the semiconductor device.

A protective material is preferably provided on a surface of the semiconductor device in order to protect the semiconductor device. However, the provision of the protective material makes the total thickness of the semiconductor device thicker by the thickness of the protective material. Moreover, a step of forming the protective material is additionally required, and manufacturing time and manufacturing costs are increased.

In view of the foregoing problems, objects in the present invention are to manufacture a highly reliable semiconductor device which is not damaged by local pressing force from the outside with high yield, and to reduce manufacturing steps and manufacturing costs.

In the present invention, a structure (also referred to as a sealing layer) in which a fiber of an organic compound or an inorganic compound is impregnated with an organic resin is provided and is subjected to thermocompression bonding, whereby a semiconductor device in which the sealing layer in which the fiber of the organic compound or the inorganic compound is impregnated with the organic resin is fixed to a layer in which a semiconductor element is provided is manufactured.

In addition, the number of layers to which the sealing layer is bonded is reduced, whereby manufacturing steps and manufacturing costs are reduced.

The present invention relates to the following methods for manufacturing a semiconductor device.

One feature of the present invention is a method for manufacturing a semiconductor device as follows. A separation layer and a semiconductor element layer including a thin film transistor are formed over a substrate. A conductive resin electrically connected to the semiconductor element layer is formed over the substrate. A first sealing layer including a first fiber and a first organic resin layer is formed over the semiconductor element layer and the conductive resin. A groove is formed in the first sealing layer, the semiconductor element layer, and the separation layer. A liquid is dropped into the groove to separate the separation layer and the semiconductor element layer from each other by a physical means. The first sealing layer over the conductive resin is removed to form an opening portion. A set of the first sealing layer and the semiconductor element layer is divided into chips. The chips are bonded to an antenna formed over a base material. A second sealing layer including a second fiber and a second organic resin layer is formed so as to cover the antenna and the chips.

In the present invention, in the fiber, the warp yarns and the weft yarns in each of which a plurality of single yarns of an organic compound or an inorganic compound are bundled may be closely woven.

In the present invention, the fiber may be a woven fabric or a nonwoven fabric.

In the present invention, the fiber may include a polyvinyl alcohol fiber, a polyester fiber, a polyamide fiber, a polyethylene fiber, an aramid fiber, a polyparaphenylene benzobisoxazole fiber, a glass fiber, or a carbon fiber.

In the present invention, the organic resin may comprise a thermosetting resin, a thermoplastic resin, or a UV curable resin.

In the present invention, the thermosetting resin may be an epoxy resin, an unsaturated polyester resin, a polyimide resin, a bismaleimide-triazine resin, or a cyanate resin.

In the present invention, the thermoplastic resin may be a polyphenylene oxide resin, a polyetherimide resin, or a fluorine resin.

In the present invention, the antenna may comprise at least one of silver (Ag), gold (Au), copper (Cu), nickel (Ni), platinum (Pt), palladium (Pd), tantalum (Ta), molybdenum (Mo), titanium (Ti), and aluminum (Al).

In the present invention, the liquid may comprise one of water, alcohol, and carbonated water.

In the present invention, the opening portion may be formed in such a manner that the sealing layer over the conductive resin is removed by laser beam irradiation.

In the present invention, wavelength of the laser beam may be in an ultraviolet region, a visible light region, or an infrared region.

In the present invention, a structure in which a fiber of an organic compound or an inorganic compound is impregnated with an organic resin is used, whereby a highly reliable semiconductor device which is not easily damaged by local pressure from the outside can be manufactured with high yield.

In addition, when a carbon fiber is used as the fiber so that the fiber is electrically conductive, electrostatic discharge in the semiconductor device can be reduced.

Further, when carbon particles are dispersed in the organic resin or a fiber bundle in the fiber, the semiconductor device can be prevented from being destroyed by static electricity. In particular, when an organic resin or a fiber in which carbon particles are dispersed is provided at a lower portion of the semiconductor device, electrostatic discharge in the semiconductor device can be more efficiently reduced.

According to the present invention, a semiconductor device whose manufacturing steps and manufacturing costs are reduced can be obtained.

BRIEF DESCRIPTION OF DRAWINGS

In the accompanying drawings:

FIGS. 8A and 8B are cross-sectional views illustrating a method of manufacturing a semiconductor device of the present invention;

FIGS. 13A to 13E are cross-sectional views illustrating a method of manufacturing a semiconductor device of the present invention;

FIGS. 15A and 15B are cross-sectional views each illustrating a method of manufacturing a semiconductor device of the present invention;

FIGS. 16A and 16B are cross-sectional views each illustrating a method of manufacturing a semiconductor device of the present invention;

FIGS. 18A and 18B are cross-sectional views illustrating a method of manufacturing a semiconductor device of the present invention;

FIGS. 20A and 20B are cross-sectional views illustrating a method of manufacturing a semiconductor device of the present invention;

BEST MODE FOR CARRYING OUT THE INVENTION

Figure 1A:
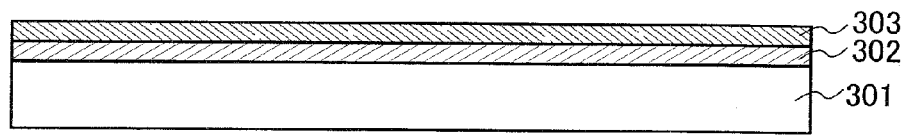
FIGS. 1A to 1E are cross-sectional views illustrating a method of manufacturing a semiconductor device of the present invention.

Hereinafter, embodiment modes of the present invention will be described with reference to drawings. Note that the present invention can be implemented in various modes, and it is easily understood by those skilled in the art that modes and details can be variously changed without departing from the scope and the spirit of the present invention. Therefore, the present invention is not construed as being limited to description of the embodiment modes. Note that in the drawings described below, the same portions or portions having similar functions are denoted by the same reference numerals, and the description thereof will not be repeated.

Embodiment Mode 1

This embodiment is described with reference to FIGS. 1A to 1E, FIGS. 2A to 2E, FIGS. 3A to 3D, FIGS. 4A and 4B, FIGS. 5A to 5D, and FIG. 6.

First, a separation layer 302 is formed over a substrate 301, and then, a semiconductor element layer 303 is formed over the separation layer 302 (see FIG. 1A).

As the substrate 301, a glass substrate, a quartz substrate, a ceramic substrate, a metal substrate in which an insulating layer is formed on at least one surface, an organic resin substrate, or the like can be used. In this embodiment mode, a glass substrate is used as the glass substrate 301.

The separation layer 302 is formed with a single-layer structure or a stacked-layer structure, each layer of the single-layer or the stacked-layer has a thickness of 30 to 200 nm and is formed with an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); or an alloy material or a compound material containing any of the above elements as its main component by a sputtering method, a plasma CVD method, a coating method, a printing method, or the like. A crystalline structure of a layer containing silicon may be amorphous, microcrystalline, or polycrystalline. Note that in this embodiment mode, a coating method refers to a method in which a solution is discharged on an object to form a film, and includes, for example, a spin coating method and a droplet discharging method in its category. Further, a droplet discharging method refers to a method in which droplets of a composition containing fine particles are discharged through a minute hole to form a pattern with a predetermined shape.

When the separation layer 302 has a single-layer structure, it is preferable to form a layer containing tungsten, molybdenum, or a mixture of tungsten and molybdenum. Alternatively, a layer containing oxide or oxynitride of tungsten, a layer containing oxide or oxynitride of molybdenum, or a layer containing oxide or oxynitride of a mixture of tungsten and molybdenum is formed. Note that a mixture of tungsten and molybdenum corresponds to an alloy of tungsten and molybdenum, for example.

When the separation layer 302 has a stacked-layer structure, it is preferable to form a metal layer as a first layer and a metal oxide layer as a second layer. Typically, as the first-metal layer, a layer containing tungsten, molybdenum, or a mixture of tungsten and molybdenum is formed. As the second layer, a layer containing oxide of tungsten, molybdenum, or a mixture of tungsten and molybdenum; a layer containing nitride of tungsten, molybdenum, or a mixture of tungsten and molybdenum; a layer containing oxynitride of tungsten, molybdenum, or a mixture of tungsten and molybdenum; or a layer containing nitride oxide of tungsten, molybdenum, or a mixture of tungsten and molybdenum is formed.

When the separation layer 302 has a stacked-layer structure in which a metal layer is formed as the first layer and a metal oxide layer is formed as the second layer, the stacked-layer structure may be formed as follows: a layer containing tungsten is formed as the metal layer, and an insulating layer made of oxide is formed thereover, whereby a layer containing oxide of tungsten is formed as the metal oxide layer at the interface between the layer containing tungsten and the insulating layer. Moreover, the metal oxide layer may be formed in such a manner that the surface of the metal layer is subjected to thermal oxidation treatment, oxygen plasma treatment, treatment using a solution having strong oxidizability, such as ozone water, or the like.

Examples of tungsten oxide include $WO_2$, $W_2O_5$, $W_4O_{11}$, and $WO_3$.

Although the separation layer 302 is formed so as to be in contact with the substrate 301 in the above step, the present invention is not limited to this step. An insulating layer to serve as a base layer may be formed so as to be in contact with the substrate 301, and the separation layer 302 may be formed so as to be in contact with the insulating layer. In this embodiment mode, as the separation layer 302, a tungsten layer with a thickness of 30 to 70 nm is formed by a sputtering method.

The thickness of the semiconductor element layer 303 is preferably 1 to 10 μm, more preferably 1 to 5 μm. When the semiconductor element layer 303 has such a thickness, a semiconductor device capable of being bent can be formed. Moreover, the area of a top surface of the semiconductor device is preferably 4 mm$^2$ or more, more preferably 9 mm$^2$ or more.

Figure 3A:
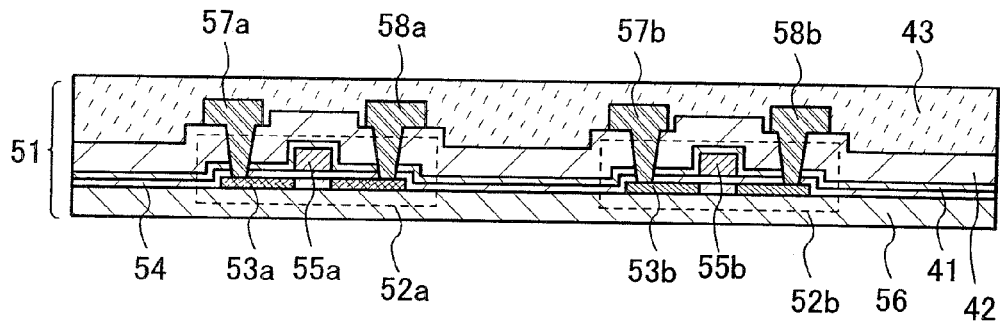
FIGS. 3A to 3D are cross-sectional views each illustrating a method of manufacturing a semiconductor device of the present invention.

As an example of the semiconductor element layer 303, an element layer 51 including thin film transistors 52a and 52b over an insulating layer 56 is shown in FIG. 3A.

The thin film transistors 52a includes a semiconductor layer 53a including a source region, a drain region, and a channel region, a gate insulating layer 54, and a gate electrode 55a. The thin film transistor 52b includes a semiconductor layer 53b including a source region, a drain region, and a channel region, the gate insulating layer 54, and a gate electrode 55b.

Interlayer insulating films 41 and 42 are formed to cover the thin film transistors 52a and 52b. Moreover, wirings 57a and 58a which are in contact with the source and drain regions in the semiconductor layer 53a, and wirings 57b and 58b which are in contact with the source and drain regions in the semiconductor layer 53b are formed over the interlayer insulating film 42. Further, an interlayer insulating film 43 is formed.

A typical example of a semiconductor device including such an element layer 51 is a microprocessor (MPU) which controls another device or performs calculation and processing of data. An MPU includes a CPU, a main memory, a controller, an interface, an I/O port, or the like, each of which can include a thin film transistor, a resistor, a capacitor, a wiring, or the like.

When an element layer 61 including a memory element 62 and the thin film transistor 52b is formed as the semiconductor element layer 303, a memory device can be manufactured as the semiconductor device.

Examples of the memory element 62 include a nonvolatile memory element including a floating gate or a charge accumulation layer; a thin film transistor and a capacitor which is connected to the thin film transistor; a thin film transistor and a capacitor which is connected to the thin film transistor and includes a ferroelectric layer; and an organic memory element in which an organic compound layer is interposed between a pair of electrodes.

Figure 3B:
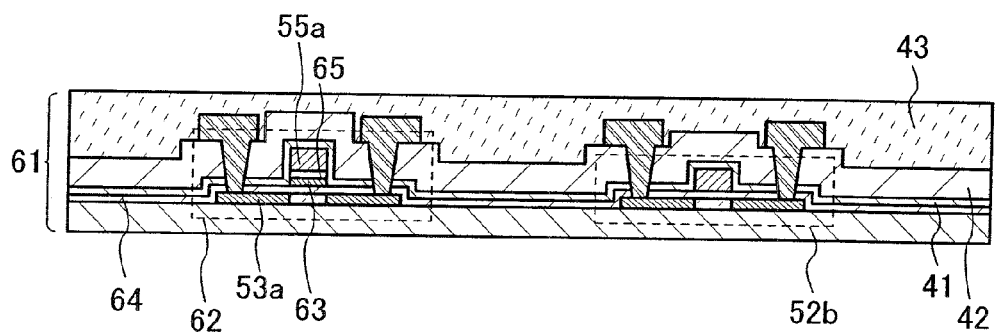

The memory element 62 shown in FIG. 3B is a nonvolatile memory element including the semiconductor layer 53a, a tunnel insulating layer 64, a floating gate electrode 63, a control insulating layer 65, and the control gate electrode 55a.

Examples of a semiconductor device including such an element layer 61 include memory devices such as a DRAM (dynamic random access memory), an SRAM (static random access memory), a FeRAM (ferroelectric random access memory), a mask ROM (read only memory), an EPROM (electrically programmable read only memory), an EEPROM (electrically erasable and programmable read only memory), and a flash memory.

Figure 3C:
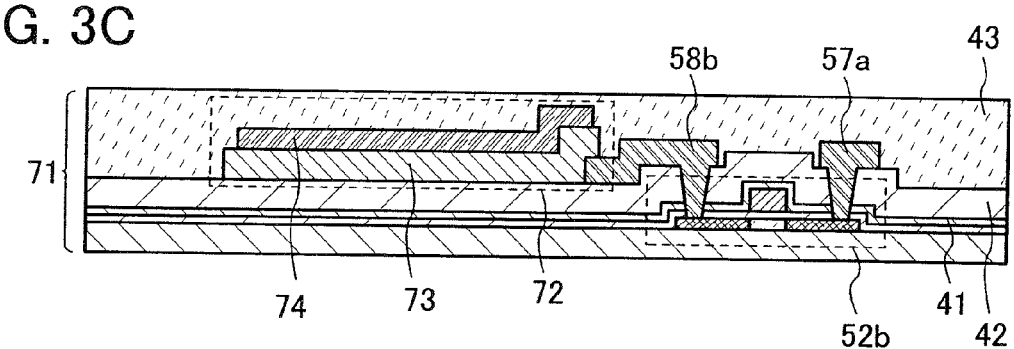

FIG. 3C illustrates an example in which an element layer 71 including a diode 72 and the thin film transistor 52b is formed as the semiconductor element layer 303.

The diode 72 shown in FIG. 3C includes the wiring 58b functioning as a first electrode, a light receiving portion 73, and a second electrode 74. The light receiving portion can be formed by using a semiconductor layer containing amorphous or crystalline silicon. Typical examples of such a semiconductor layer include a silicon layer, a silicon germanium layer, or a silicon carbide layer; or a PN junction layer or a PIN junction layer of the above.

As a semiconductor device including such an element layer 71, an optical sensor, an image sensor, a solar battery, or the like can be manufactured. Examples of the diode 72 include a PN diode, a PIN diode, an avalanche diode, a Schottky diode, or the like in which amorphous silicon or polysilicon is used.

Figure 3D:
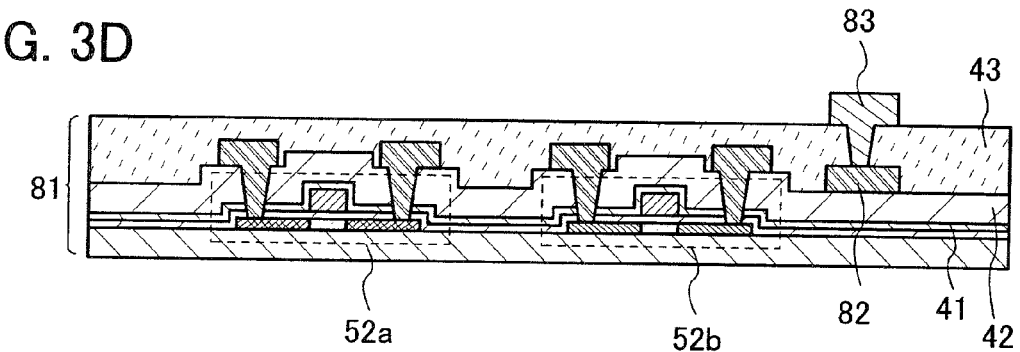

When an element layer 81 which includes the thin film transistors 52a and 52b, wirings 82 connected to the source and drain regions of the semiconductor layer in the thin film transistors 52a and 52b, and an electrode 83 electrically connected to the wiring 82 is formed as the semiconductor element layer 303, an ID tag, an IC tag, an RF (radio frequency) tag, a wireless tag, an electronic tag, an RFID (radio frequency identification) tag, an IC card, an ID card, or the like which can wirelessly transmit and receive information (hereinafter referred to as RFID) can be manufactured as the semiconductor device (see FIG. 3D).

Figure 1B:
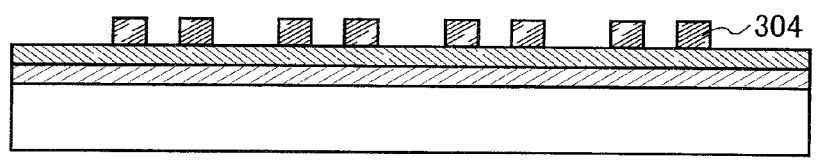

After the semiconductor element layer 303 is formed, a conductive resin 304 which is electrically connected to the wirings 57a, 57b, 58a, and 58b is formed over the semiconductor element layer 303 (see FIG. 1B). For the conductive resin 304, at least one of, that is, one or more of metal particles of silver (Ag), gold (Au), copper (Cu), nickel (Ni), platinum (Pt), palladium (Pd), tantalum (Ta), molybdenum (Mo), titanium (Ti), aluminum (Al), or the like; fine particles of silver halide; or dispersible nanoparticles can be used. In this embodiment mode, as the conductive resin 304, a resin containing silver is formed by a screen printing method and then hardened at 300° C. for 30 minutes in an air atmosphere.

Figure 1C:
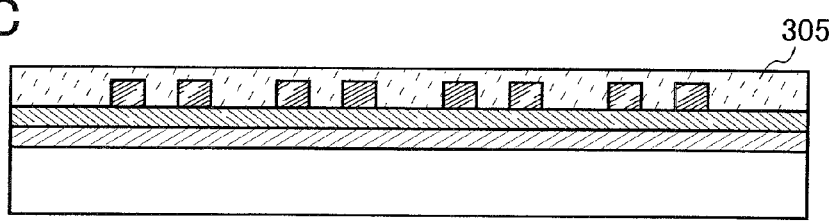

Next, a sealing layer 305 including a fiber 113 and an organic resin layer 114 is formed over the semiconductor element layer 303 and the conductive resin 304 (see FIG. 1C).

The fiber 113 is a woven fabric or a nonwoven fabric using a high-strength fiber of an organic compound or an inorganic compound. The high-strength fiber is specifically a fiber with a high tensile modulus of elasticity or a fiber with a high Young's modulus. Typical examples of the high-strength fiber include a polyvinyl alcohol fiber, a polyester fiber, a polyamide fiber, a polyethylene fiber, an aramid fiber, a polyparaphenylene benzobisoxazole fiber, a glass fiber, and a carbon fiber. As the glass fiber, a glass fiber using E glass, S glass, D glass, Q glass, or the like can be used. Note that the fiber 113 may be formed from one kind or a plurality of the above-described high-strength fibers.

When a carbon fiber is used as the fiber 113 so that the fiber 113 is electrically conductive, electrostatic discharge can be reduced.

Alternatively, the fiber 113 may be a woven fabric formed using bundles of fibers (single yarns) (hereinafter also referred to as fiber bundles) for the warp yarn and the weft yarn, or a nonwoven fabric obtained by stacking bundles of plural kinds of fibers in a random manner or in one direction. In the case of a woven fabric, a plain-woven fabric, a twilled fabric, a satin-woven fabric, or the like can be used as appropriate.

The fiber bundle may have a cross section of a circular shape or an elliptical shape. As the bundle of fibers, a bundle of fibers which has been subjected to fiber opening with a high-pressure water stream, high-frequency vibration using liquid as a medium, continuous ultrasonic vibration, pressing with a roller, or the like may be used. A bundle of fibers which is subjected to fiber opening has a large width, has a smaller number of single yarns in the thickness direction, and has a cross section of an elliptical shape or a flat shape. Further, when a loosely twisted yarn is used as the bundle of fibers, the fiber bundle is easily flattened and has a cross section of an elliptical shape or a flat shape. By using a fiber bundle having a cross section of an elliptical shape or a flat shape as described above, it is possible to make the fiber 113 thinner. Accordingly, the sealing layer 305 can be made thinner, and thus, a thin semiconductor device can be manufactured. Although the diameter of the fiber bundle is preferably 4 to 400 μm, more preferably 4 to 200 μm, it is theoretically possible that the diameter of the fiber bundle is even smaller. Moreover, although the thickness of the fiber is preferably 4 to 20 μm, it is theoretically possible that the thickness of the fiber is even smaller, and the thickness of the fiber depends on a material of the fiber.

Figure 4A:
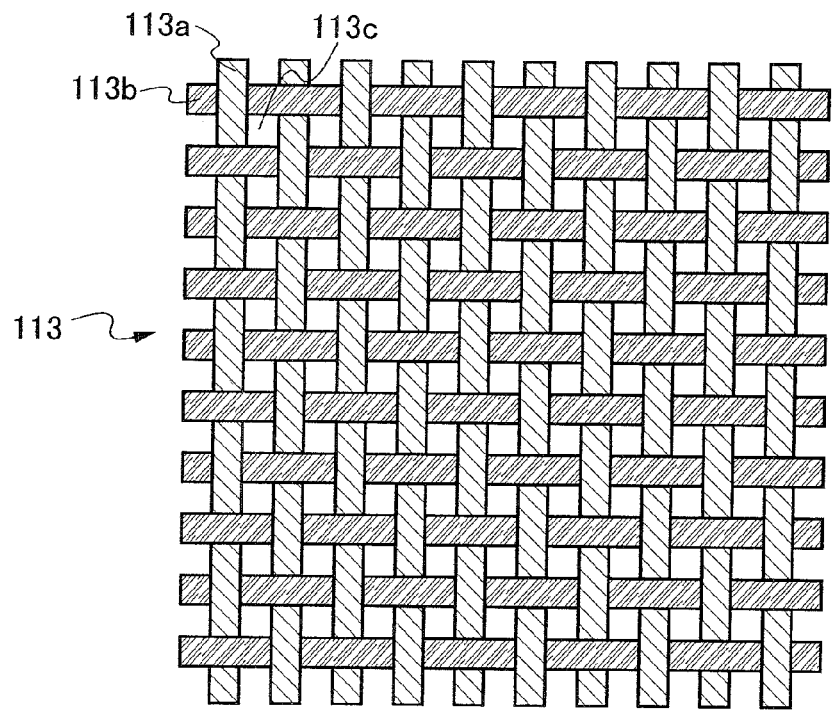
FIGS. 4A and 4B are top views each illustrating a fiber of the present invention.
Figure 4B:
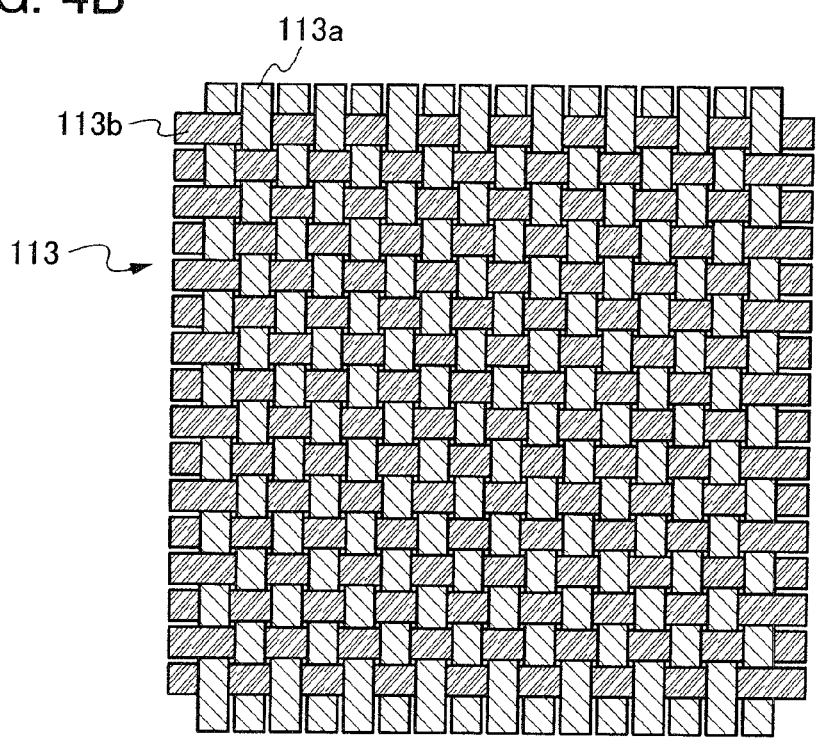

FIGS. 4A and 4B each are a top view of the fiber 113 which is a woven fabric formed by using bundles of fibers for the warp yarn and the weft yarn.

As shown in FIG. 4A, the fiber 113 is woven using warp yarns 113a spaced at regular intervals and weft yarns 113b spaced at regular intervals. Such a fiber has regions without the warp yarns 113a and the weft yarns 113b (referred to as basket holes 113c). Such a fiber 113 is further impregnated with an organic resin; thus, adhesion between the fiber 113 and the element layer can be increased.

As shown in FIG. 4B, in the fiber 113, the density of the warp yarns 113a and the weft yarns 113b may be high and the proportion of the basket holes 113c may be low. Typically, the area of the basket hole 113c is preferably smaller than that of a locally pressed portion, and preferably has a rectangular shape having a side with a length of 0.01 to 0.2 mm. When the basket hole 113c in the fiber 113 has such a small area, pressure can be absorbed by the entire fiber 113 even if the fiber 113 is pressed by a member with a sharp tip (typically, a writing material such as a pen or a pencil).

Further, in order to enhance permeability of an organic resin into the inside of the bundle of fibers, the fiber may be subjected to surface treatment. Examples of the surface treatment include corona discharge, plasma discharge, and the like for activating a surface of the fiber as well as surface treatment using a silane coupling agent or a titanate coupling agent.

For the organic resin layer 114 which is impregnated into the fiber 113 and seals a surface of the semiconductor element layer 303, a thermosetting resin such as an epoxy resin, an unsaturated polyester resin, a polyimide resin, a bismaleimide-triazine resin, or a cyanate resin; a thermoplastic resin such as a polyphenylene oxide resin, a polyetherimide resin, or a fluorine resin; a plurality of the above-described thermosetting resins and the thermoplastic resins; a UV curable resin; or an organic plastic resin can be used. By using the above-described organic resin, the fiber 113 can be fixed to the semiconductor element layer 303 by heat treatment. Note that the higher the glass transition temperature of the organic resin layer 114 is, the less the organic resin layer 114 is damaged by local pressing force, which is preferable.

In addition, the thickness of the sealing layer 305 is preferably 10 to 100 μm, more preferably 10 to 30 μm. When the structure having such a thickness is used, a thin semiconductor device capable of being bent can be formed.

Highly thermally conductive filler may be dispersed in the organic resin layer 114 or in the bundles of fibers of the fiber 113. Examples of the highly thermally conductive filler include aluminum nitride, boron nitride, silicon nitride, alumina, and metal particles of silver, copper, or the like. When the highly thermally conductive filler is included in the organic resin or in the bundles of fibers, heat generated in the element layer can be easily released to the outside. Accordingly, thermal storage in the semiconductor device can be suppressed, and destruction of the semiconductor device can be reduced.

Alternatively, carbon particles may be dispersed in the organic resin layer 114 or a bundle of fibers in the fiber 113. In particular, when a thin film transistor is included in the semiconductor element layer 303, the sealing layer 305 including the organic resin layer 114 or the fiber 113 in which the carbon particles are dispersed is provided below the TFT, the TFT can be prevented from being destroyed by static electricity.

Figure 5A:
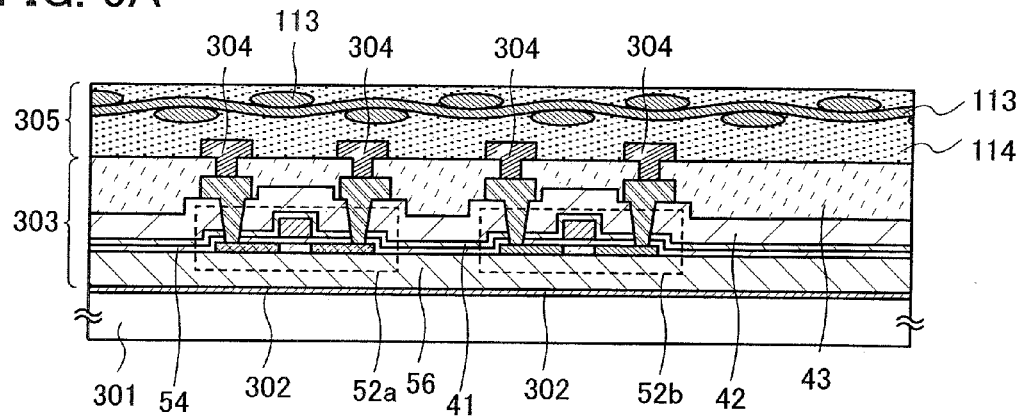
FIGS. 5A to 5D are cross-sectional views illustrating a method of manufacturing a semiconductor device of the present invention.

FIG. 5A is a cross-sectional view in the case where the element layer 51 shown in FIG. 3A is used as the semiconductor element layer 303. In FIG. 5A, the fiber 113 is shown as a woven fabric which is plain-woven using fiber bundles each having a cross section of an elliptical shape. Moreover, the thin film transistors 52a and 52b are larger than the fiber bundle of the fiber 113; however, the thin film transistors 52a and 52b may be smaller than the fiber bundle of the fiber 113 in some cases.

Further, the conductive resin 304 is electrically connected to the wirings 57a, 57b, 58a, and 58b.

In this embodiment mode, in order to fix the sealing layer 305 to the semiconductor element layer 303, the sealing layer 305 is provided over the semiconductor element layer 303 and after that, a first press step and a second press step are performed.

First, the first press step (a vacuum press step) is performed in order to remove bubbles entering between the sealing layer 305 and the semiconductor element layer 303 and to temporarily fix the sealing layer 305. In this embodiment mode, the first press step is performed in such a manner that the temperature is raised from a room temperature to 100° C. in 30 minutes in a vacuum atmosphere.

Next, the second press step is performed in order to uniformly fix the sealing layer 305 to the semiconductor element layer 303. In the embodiment mode, as the second press step, the temperature is held at 135° C. under a pressure of 0.3 MPa for 15 minutes, and after that, the temperature is raised to 195° C. and held for 60 minutes.

Figure 1D:
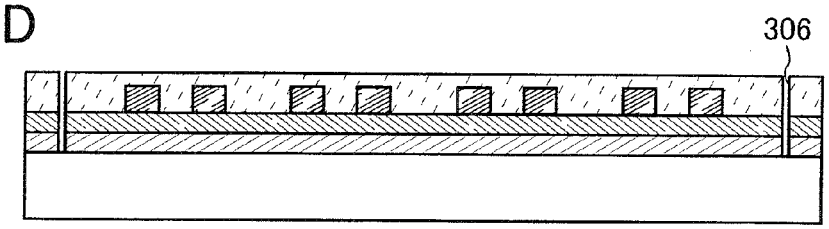

Next, as shown in FIG. 1D, grooves 306 are formed in the sealing layer 305, the semiconductor element layer 303, and the separation layer 302 by laser beam irradiation or cutting with an edged tool.

As a laser beam to be emitted to form the groove 306, it is preferable to use a laser beam having a wavelength which is absorbed by any of the separation layer 302, the semiconductor element layer 303, and the sealing layer 305. Typically, a laser beam in an ultraviolet region, a visible light region, or an infrared region is selected as appropriate to perform irradiation.

As a laser capable of emitting such a laser beam, any of the following lasers can be used: an excimer laser such as a KrF, ArF, or XeCl laser; a gas laser such as a He, He—Cd, Ar, He—Ne, HF, or $CO_2$ laser; a solid-state laser such as a crystal laser using crystals such as YAG, $GdVO_4$, $YVO_4$, YLF, or $YAlO_3$ which are doped with Cr, Nd, Er, Ho, Ce, Co, Ti, or Tm, a glass laser, or a ruby laser; or a semiconductor laser such as a GaN, GaAs, GaAlAs, or InGaAsP laser. Note that a fundamental wave to a fifth harmonic are preferably used in a solid-state laser as appropriate.

When the groove 306 is formed with the edged tool, a cutter knife or the like may be used as the edged tool.

Figure 5B:
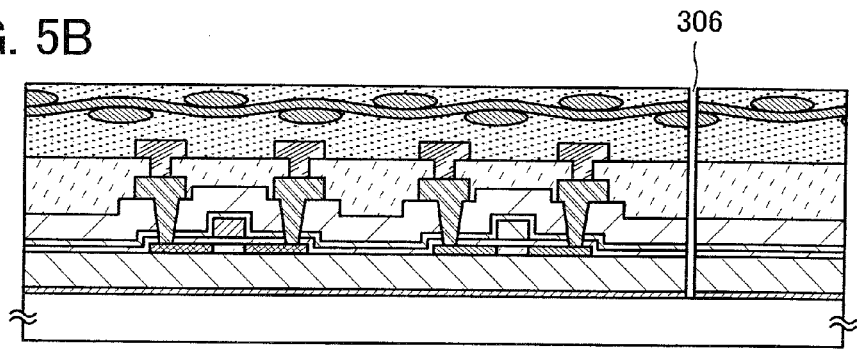

In this embodiment mode, the groove 306 is formed using a UV laser. FIG. 5B is a cross-sectional view in the case where the element layer 51 shown in FIG. 3A is used as the semiconductor element layer 303.

Next, as shown in FIG. 1D, a liquid is dropped into the grooves 306, and the separation layer 302 and the semiconductor element layer 303 are separated from each other by a physical means. The physical means refers to a dynamic means or a mechanical means, for example, a means for changing some dynamical energy (mechanical energy). Typically, the physical means is to apply mechanical force (e.g., a peeling process with human hands or with a gripper, or a separation process by rotating a roller). At this time, when an adhesive sheet which can be separated by light or heat is provided on a surface of the sealing layer 305, separation can be performed more easily. The adhesive sheet may be bonded by a mechanical means or a human means described above. Note that when bubbles enter between the sealant sheet and the sealing layer 305, a separation defect might occur in transfer; therefore, bubbles should be prevented from entering.

Figure 1E:
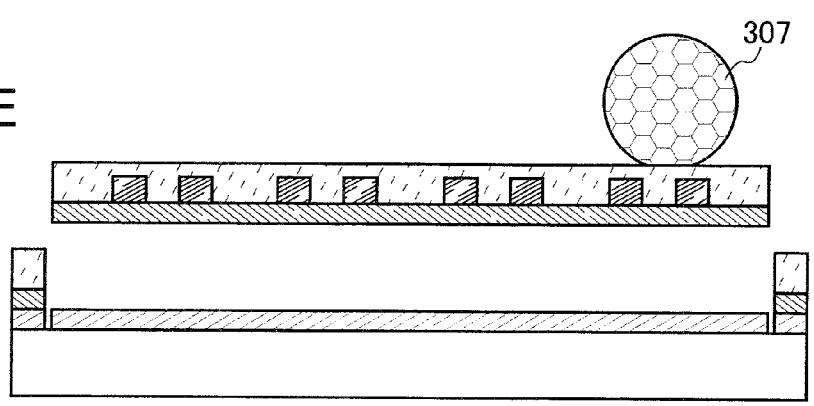

In this embodiment mode, water, for example, pure water is used as the liquid, and a roller 307 is rotated over the sealing layer 305, whereby the semiconductor element layer 303, the conductive resin 304, and the sealing layer 305 are transferred to the roller 307 (see FIG. 1E).

Any liquid can be used as long as it is volatile and does not damage the separation layer 302. By addition of the liquid, generation of static electricity in a separation step which is performed later can be suppressed, and a chip can be prevented from being damaged by static electricity. Accordingly, any liquid that has an insulating property to some extent and does not adversely affect the semiconductor element layer 303 can be used.

For example, other than pure water, one or a mixture of alcohol such as ethanol, carbonated water, or the like; or a liquid containing at least one of the above liquids may be used. Moreover, in this embodiment mode, a rubber roller having a diameter of 300 mm is used as the roller 307.

When the separation layer 302 and the semiconductor element layer 303 are separated from each other by dropping the liquid into the grooves 306, generation of static electricity in separation can be prevented, and damage to the semiconductor element layer 303 can be suppressed. Thus, operation yield is drastically improved.

Next, in order to connect the semiconductor element layer 303 and the outside, the sealing layer 305 over the conductive resin 304 is removed to form an opening portion 312. The sealing layer 305 is removed by being irradiated with a laser beam 313 (see FIG. 2A).

Typically, the laser beam 313 may be selected from a laser beam in an ultraviolet region, a visible light region, or an infrared region as appropriate.

As a laser capable of emitting such a laser beam 313, any of the following lasers can be used: an excimer laser such as a KrF, ArF, or XeCl laser; a gas laser such as a He, He—Cd, Ar, He—Ne, HF, or $CO_2$ laser; a solid-state laser such as a crystal laser using crystals such as YAG, $GdVO_4$, $YVO_4$, YLF, or $YAlO_3$ which are doped with Cr, Nd, Er, Ho, Ce, Co, Ti, or Tm, a glass laser, or a ruby laser; or a semiconductor laser such as a GaN, GaAs, GaAlAs, or InGaAsP laser. Note that a fundamental wave to a fifth harmonic are preferably used in a solid-state laser as appropriate.

In this embodiment mode, the laser beam 313 of a YAG laser with a wavelength of 355 nm, and nine shots of laser irradiation with a slit size of 150 μm square are performed per one conductive resin 304, whereby the sealing layer 305 is removed, and the opening portion 312 is formed.

In this embodiment mode, since the sealing layer 305 over the region where the conductive resin 304 is formed is irradiated with the laser beam 313, the laser beam 313 is blocked by the conductive resin 304 and does not reach the semiconductor element layer 303. That is, the semiconductor element layer 303 is not irradiated with the laser beam 313, and damage to the semiconductor element layer 303 can be suppressed.

Note that even when the sealing layer 305 over the conductive resin 304 is irradiated with the laser beam 313, the sealing layer 305 is not completely removed, and the fiber 113 remains in the opening portion 312. In a later step, a conductive adhesive material 315 is formed in the opening portion 312. Since the fiber 113 remains in the opening portion 312, the conductive adhesive material 315 is more firmly bonded, and physical strength can be improved. Thus, resistance to bending can be improved.

Next, the sealing layer 305 and the semiconductor element layer 303 are irradiated with a laser beam, and grooves 314 are formed. A set of the sealing layer 305 and the semiconductor element layer 303 is divided into chips 321, using the grooves 314 (see FIG. 2B).

In this embodiment mode, the grooves 314 are formed using a UV laser beam as the laser beam. The size of each of the sealing layer 305 and the semiconductor element layer 303 before the division is 120 mm×100 mm, and the size of the chip 321 formed after the division is 10 mm×10 mm.

Figure 5C:
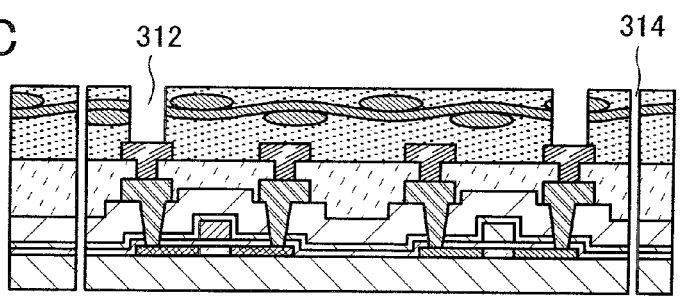

FIG. 5C is a cross-sectional view in the case where the element layer 51 shown in FIG. 3A is used as the semiconductor element layer 303.

Figure 2A:
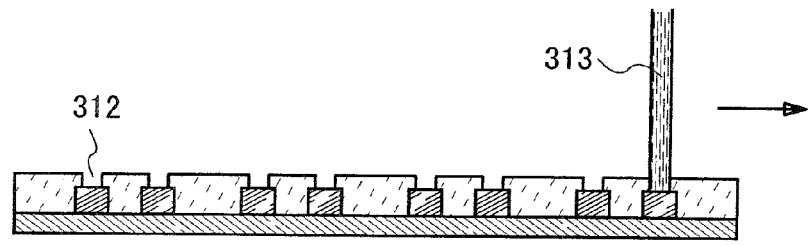
FIGS. 2A to 2E are cross-sectional views illustrating a method of manufacturing a semiconductor device of the present invention.
Figure 2B:
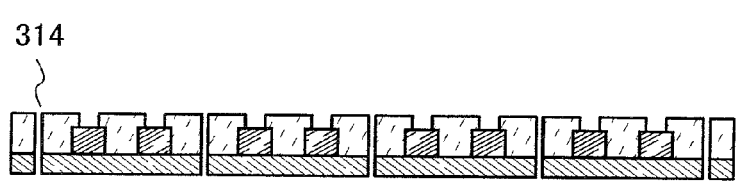
Figure 2C:
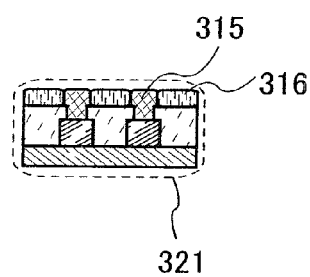
Figure 5D:
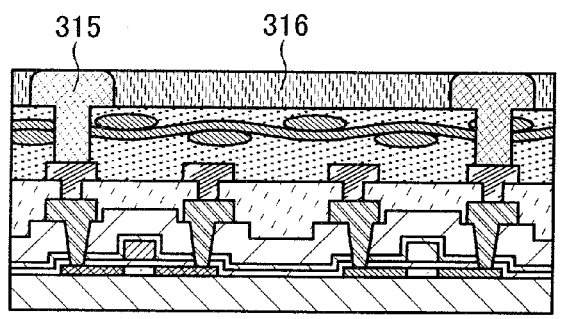
Figure 6:
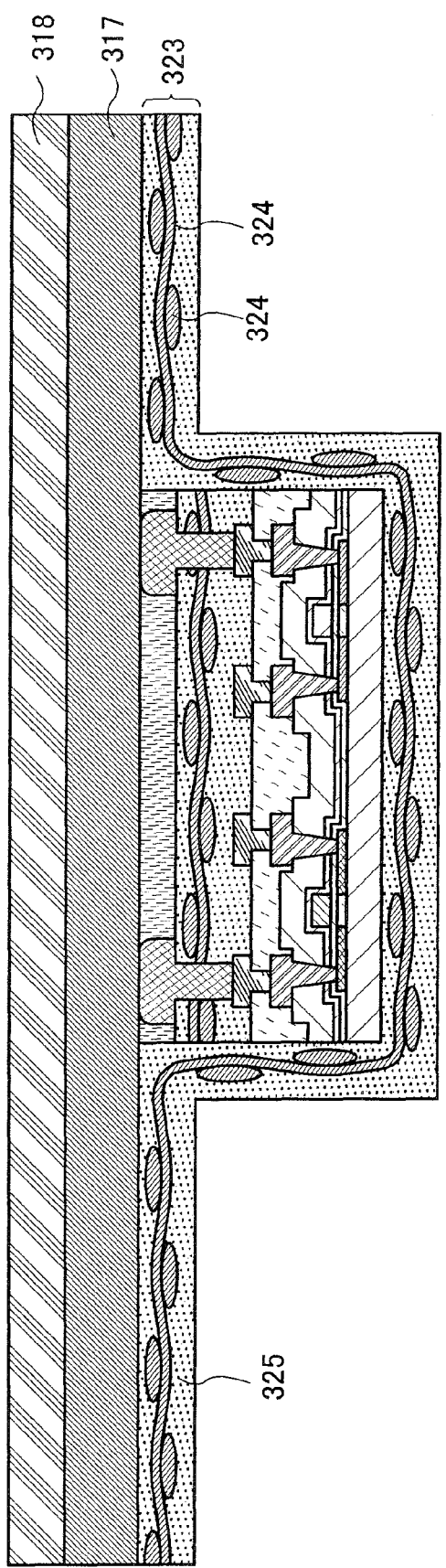
FIG. 6 is a cross-sectional view illustrating a method of manufacturing a semiconductor device of the present invention.

After the division into individual chips 321, the conductive adhesive material 315 which is electrically connected to the conductive resin 304 is formed in the opening portion 312, and an adhesive material 316 is formed on a surface of the sealing layer 305, which is not provided with the conductive adhesive material 315 (see FIG. 2C). In this embodiment mode, a conductive adhesive material containing silver is used as the conductive adhesive material 315. FIG. 5D is a cross-sectional view in the case where the element layer 51 shown in FIG. 3A is used as the semiconductor element layer 303.

Next, an external antenna 317 is formed on a substrate 318.

The antenna 317 is formed in such a manner that droplets or a paste containing at least one of, that is, one or more of metal particles of silver (Ag), gold (Au), copper (Cu), nickel (Ni), platinum (Pt), palladium (Pd), tantalum (Ta), molybdenum (Mo), titanium (Ti), aluminum (Al), or the like is/are discharged onto the substrate 318 by a droplet discharging method (such as an inkjet method or a dispenser method) and then dried and baked. The antenna is formed by a droplet discharging method, whereby the number of steps in forming the antenna can be reduced, and accordingly, cost of manufacturing the antenna can be reduced.

Alternatively, the antenna 317 may be formed by a screen printing method. When a screen printing method is used, as a material of the antenna 317, a conductive paste in which conductive particles each having a diameter of several nanometers to several tens of micrometers are dissolved or dispersed in an organic resin is selectively printed. As the conductive particle, at least one of, that is, one or more of metal particles of silver (Ag), gold (Au), copper (Cu), nickel (Ni), platinum (Pt), palladium (Pd), tantalum (Ta), molybdenum (Mo), titanium (Ti), aluminum (Al), or the like; fine particles of silver halide; or dispersible nanoparticles can be used. Moreover, for the organic resin included in the conductive paste, one or more of organic resins selected from organic resins which functions as binders, solvents, dispersants, or coating materials of metal particles can be used. Typically, organic resins such as an epoxy resin and a silicone resin can be employed.

Further alternatively, the antenna 317 may be formed by gravure printing other than a screen printing method, or can be formed by using a conductive material by a plating method, a sputtering method, or the like.

In this embodiment mode, the antenna 317 is formed by copper plating.

As the substrate 318, a film, paper, or the like may be used, or a sealing layer having the same structure as the sealing layer 305 may be used. When a film is used as the substrate 318, an organic film such as an aramid film, a polyethylene naphthalate (PEN) film, a polyethylene terephthalate (PET) film, or a polyethersulfone (PES) may be used.

Figure 2D:
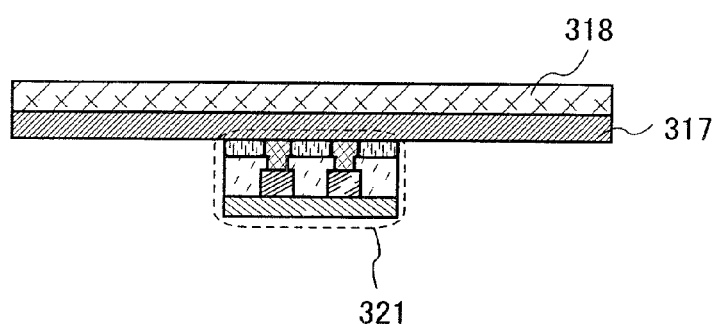

The chip 321 is bonded to the antenna 317 with the adhesive material 316 (see FIG. 2D). The semiconductor element layer 303 is electrically connected to the antenna 317 through the conductive resin 304 and the conductive adhesive material 315.

In this embodiment mode, an aramid film is used as the substrate 318.

Figure 2E:
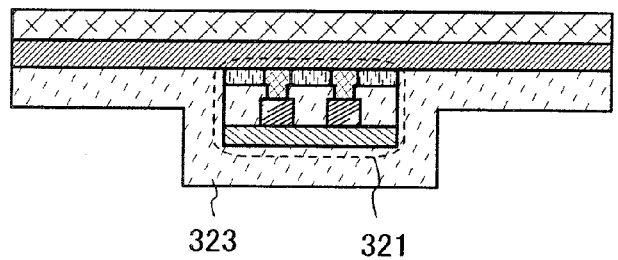

Next, a sealing layer 323 is bonded to the chip 321 and the antenna 317 so as to cover the chip 321 and the antenna 317 (see FIG. 2E). In this embodiment mode, a layer having the same structure as the sealing layer 305 is used as the sealing layer 323 (see FIG. 6). That is, the sealing layer 323 in which a fiber 324 is impregnated with an organic resin layer 325 is used.

In the present invention, the sealing layer 305 is formed over the semiconductor element layer 303, and the sealing layer 323 is formed on a surface which does not face the sealing layer 305, that is, a surface on which the conductive resin 304 is not formed, whereby a semiconductor device with high withstand voltage and with the reduced number of manufacturing steps can be manufactured.

Further, the organic resin layer 325 in the sealing layer 323 is bonded to a gap between the antenna 317 and the chip 321, and a cross section of the chip 321, whereby adhesion is improved.

As described above, a semiconductor device in this embodiment mode can be obtained. According to this embodiment mode, a sealing layer that is highly resistant to external pressure can be formed even through fewer manufacturing steps. Since the semiconductor device obtained through the steps in this embodiment mode includes a sealing layer in which a fiber is impregnated with an organic resin, a highly reliable semiconductor device which is not easily damaged by local pressure from the outside can be manufactured with high yield.

Embodiment Mode 2

In this embodiment mode, an example in which a sealing layer is formed by a manufacturing method different from that in Embodiment Mode 1 is described with reference to FIGS. 7A and 7B and FIGS. 8A and 8B.

First, the manufacturing steps up to and including the step of formation of the conductive resin 304 (see FIGS. 1A and 1B) are performed based on Embodiment Mode 1. Next, the fiber 113 is provided over the semiconductor element layer 303 (see FIG. 7A).

Then, the organic resin layer 114 is formed over the fiber 113 and the semiconductor element layer 303. At this time, the fiber 113 is impregnated with an organic resin in the organic resin layer 114. That is, the fiber 113 is included in the organic resin layer 114. Accordingly, adhesion between the fiber 113 and the organic resin layer 114 is increased.

Next, the organic resin layer 114 is heated so that the organic resin in the organic resin layer 114 is plasticized or cured. Note that when the organic resin is an organic plastic resin, the organic resin which is plasticized is then cured by cooling the organic resin to a room temperature. Alternatively, when the organic resin is a UV curable resin, it is cured by UV irradiation.

Figure 7A:
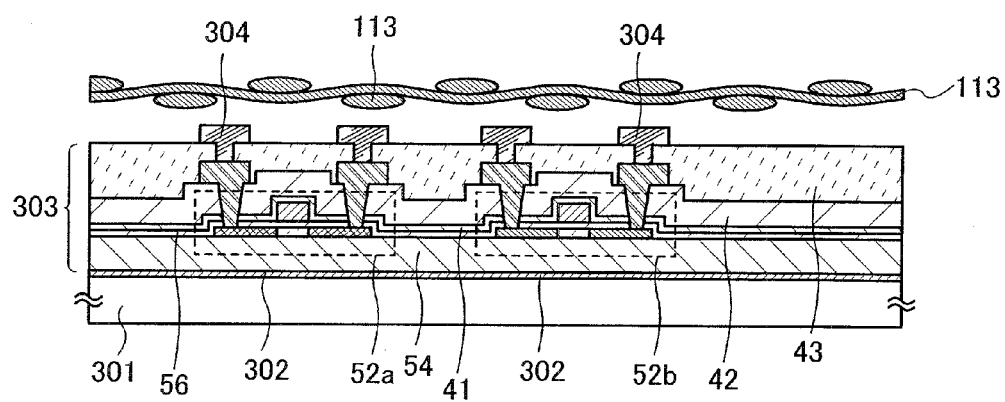
FIGS. 7A and 7B are cross-sectional views illustrating a method of manufacturing a semiconductor device of the present invention.
Figure 7B:
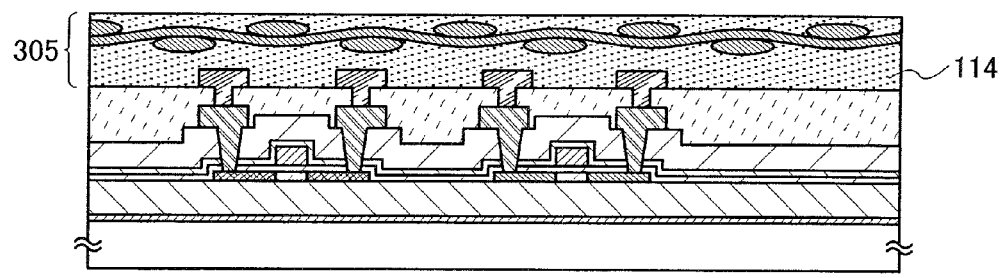

Thus, as shown in FIG. 7B, the organic resin layer 114 which is impregnated into the fiber 113 and fixed to one surface of the semiconductor element layer 303 is formed. Note that the organic resin layer 114 and the fiber 113 which are fixed to one surface of the semiconductor element layer 303 serve as the sealing layer 305. Accordingly, a structure similar to that shown in FIG. 1B can be obtained.

Further, the steps in FIGS. 1D and 1E and FIGS. 2A to 2D are performed.

Next, the fiber 324 is provided on surfaces of the chip 321 and the antenna 317 (see FIG. 8A). The sealing layer 323 is obtained in a manner similar to the sealing layer 305 such that the fiber 324 is impregnated with the organic resin in the organic resin layer 325 and the organic resin is hardened (see FIG. 8B). Accordingly, a structure similar to that shown in FIG. 2E can be obtained.

According to this embodiment mode, a sealing layer that is highly resistant to external pressure can be formed even through fewer manufacturing steps.

In this embodiment mode, the thickness of the organic resin layer 114 or the organic resin layer 325 can be changed, and accordingly, the thickness of the sealing layer 305 or the sealing layer 323 can also be changed. For example, the sealing layers 305 and 323 that are thinner than the sealing layers 305 and 323 in Embodiment Mode 1 can be obtained. Thus, the total thickness of the semiconductor device can be reduced.

Embodiment Mode 3

In this embodiment mode, an application example of a semiconductor device of the present invention is described. In this embodiment mode, an RFID is described as one application example of the semiconductor device.

Figure 9:
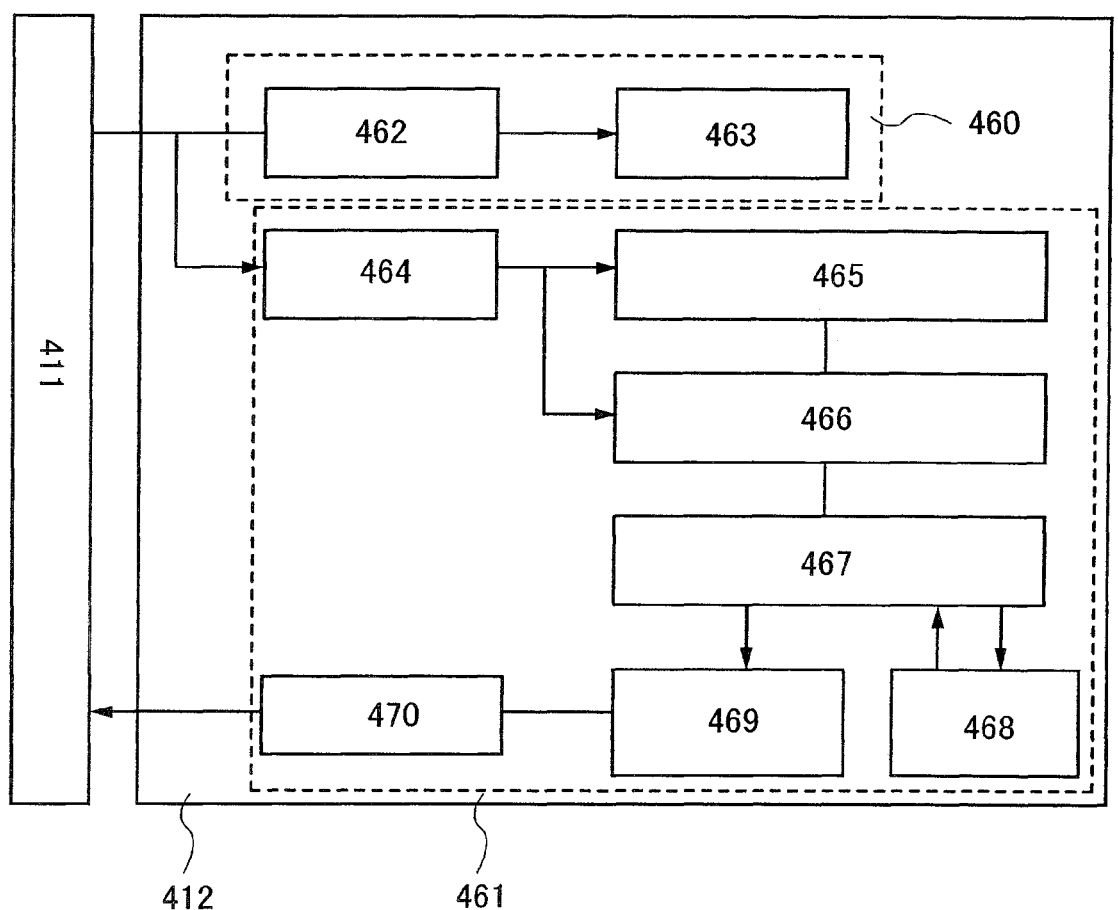
FIG. 9 is a block diagram illustrating an application example of a semiconductor device of the present invention.

First, a circuit structure example of an RFID 501 to which the semiconductor devices of the present invention is applied is described. FIG. 9 is a block circuit diagram of the RFID 501.

The RFID 501 in FIG. 9 conforms to specifications of ISO 15693 of the International Organization for Standardization, and it is a vicinity type and has a communication signal frequency of 13.56 MHz. Moreover, reception only responds to a data reading instruction, a data transmission rate in transmission is approximately 13 kHz, and the Manchester code is used for a data encoding format.

A circuit portion 412 of the RFID 501 is roughly divided into a power supply portion 460 and a signal processing portion 461. The power supply portion 460 includes a rectifier circuit 462 and a storage capacitor 463. Further, the power supply portion 460 may be provided with a protection circuit portion (also referred to as a limiter circuit portion) for protecting the internal circuit when the amount of electric power received by an antenna 411 is too high, and a protection circuit control circuit portion for controlling whether or not to operate the protection circuit portion. The provision of the circuit portions can prevent malfunction caused when a large amount of electric power is received by the RFID under the situation in which a communication range between the RFID and a communication device is extremely short, for example. Thus, the reliability of the RFID can be improved. That is, the RFID can be normally operated without degradation of an element in the RFID or destruction of the RFID itself.

The circuit portion 412 is formed in the chip 321 described in Embodiment Modes 1 and 2.

Note that in this embodiment mode, a communication device may have a means to transmit and receive information to/from the RFID by wireless communication. Examples of the communication device include a reader which reads information; a reader/writer which has a function of reading and a function of writing; and a mobile phone, a computer, and the like which have one of or both the function of reading and the function of writing.

The rectifier circuit 462 rectifies a carrier wave received by the antenna 411 and generates DC voltage. The storage capacitor 463 smoothes the DC voltage generated in the rectifier circuit 462. The DC voltage generated in the power supply portion 460 is supplied to each circuit in the signal processing portion 461 as power supply voltage.

The signal processing portion 461 includes a demodulation circuit 464, a clock generation/correction circuit 465, a recognition/determination circuit 466, a memory controller 467, a mask ROM 468, an encoding circuit 469, and a modulation circuit 470.

The demodulation circuit 464 is a circuit which demodulates a signal received by the antenna 411. The received signal which is demodulated by the demodulation circuit 464 is inputted to the clock generation/correction circuit 465 and the recognition/determination circuit 466.

The clock generation/correction circuit 465 generates a clock signal which is necessary for operating the signal processing portion 461, and also has a function of correcting the clock signal. For example, the clock generation/correction circuit 465 includes a voltage controlled oscillator circuit (hereinafter referred to as a VCO circuit), employs an output of the VCO circuit as a feedback signal, compares a phase between a supplied signal and the feedback signal, and adjusts an output signal by using negative feedback so that the signal to be inputted and the feedback signal have a certain phase.

The recognition/determination circuit 466 recognizes and determines an instruction code. The instruction code recognized and determined by the recognition/determination circuit 466 is an end-of-frame (EOF) signal, a start-of-frame (SOF) signal, a flag, a command code, a mask length, a mask value, or the like. Moreover, the recognition/determination circuit 466 has a cyclic redundancy check (CRC) function that identifies a transmission error.

The memory controller 467 reads data from the mask ROM 468 in response to a signal processed by the recognition/determination circuit 466. An ID or the like is stored in the mask ROM 468. The mask ROM 468 is mounted on a RFID, whereby the read-only RFID 501 in which data is incapable of being replicated or altered is formed. When the read-only RFID 501 is embedded in paper, forgery prevention paper can be obtained.

The encoding circuit 469 encodes the data which is read from the mask ROM 468 by the memory controller 467. The encoded data is modulated by the modulation circuit 470. The data modulated by the modulation circuit 470 is transmitted from the antenna 411 as a carrier wave.

Next, usage examples of an RFID are described. An RFID of the present invention can be used for a variety of paper media and film media. In particular, the RFID of the present invention can be used for a variety of paper media for which forgery prevention is necessary. Examples of the paper media include banknotes, family registers, residence certificates, passports, licenses, identification cards, membership cards, expert opinions in writing, patient's registration cards, commuter passes, promissory notes, checks, carriage notes, cargo certificates, warehouse certificates, stock certificates, bond certificates, gift certificates, tickets, and deeds of mortgage.

Further, by implementation of the present invention, a lot more information than that which is visually shown on a paper medium can be held in the paper medium or the film medium. Accordingly, when the RFID of the present invention is applied to a product label or the like, development of an electronic system for merchandise management or prevention of product theft can be realized. Usage examples of the paper according to the present invention are described below with reference to FIGS. 10A to 10E.

Figure 10A:
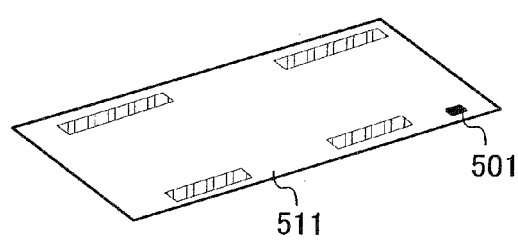
FIGS. 10A to 10E each illustrate an application example of a semiconductor device of the present invention.
Figure 10B:
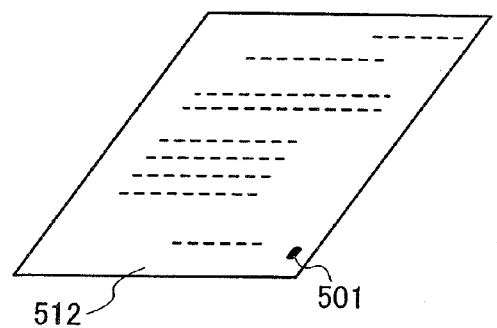

FIG. 10A illustrates an example of a bearer bond 511 including paper embedded with the RFID 501 of the present invention. The bearer bond 511 includes, but is not limited to, a stamp, a ticket, an admission ticket, a gift certificate, a book coupon, a stationery coupon, a beer coupon, a rice coupon, a variety of gift coupons, and a variety of service coupons in its category. Further, FIG. 10B illustrates an example of a certificate 512 (e.g., a residence certificate or a family register) including the paper embedded with the RFID 501 of the present invention.

Figure 10C:
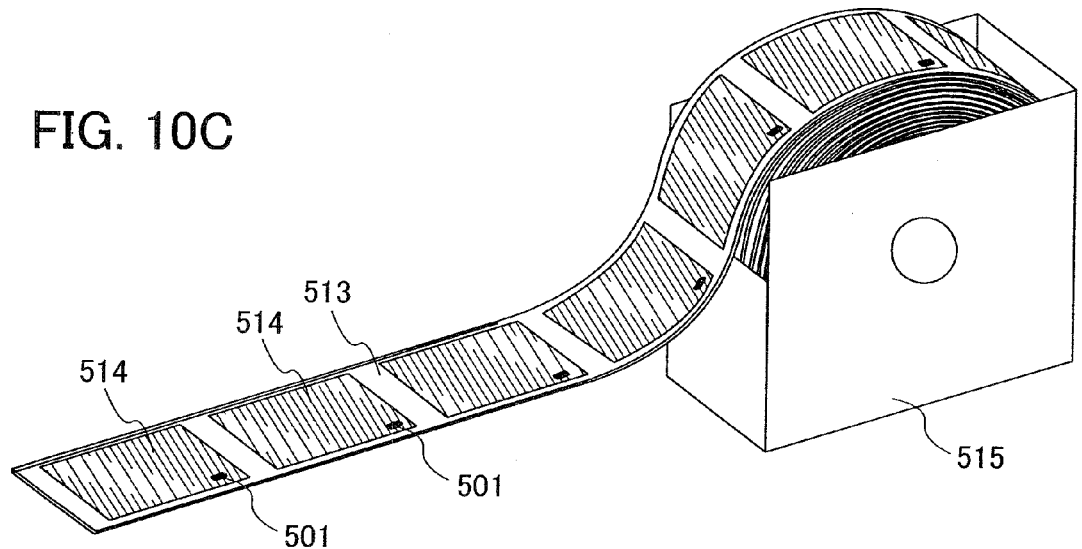

FIG. 10C illustrates an example in which the RFID of the present invention is applied to a label. Over a label base (separate paper) 513, a label (an ID sticker) 514 is formed using the paper embedded with the RFID 501. The label 514 is stored in a box 515. On the label 514, information regarding a product or a service (such as product name, brand, trademark, trademark owner, seller, or manufacturer) is printed. Moreover, a unique ID number of the product (or a category of the product) is stored in the RFID 501, whereby forgery, infringement of intellectual property rights such as a trademark right or a patent right, and illegal activity such as unfair competition can be spotted easily. The RFID 501 can be inputted with a large amount of information that cannot all be written on a container or a label of the product, such as home of the production, area of sales, quality, raw material, effect, use, quantity, shape, price, production method, usage method, time of production, time of use, expiration date, instruction manual, and intellectual property information relating to the product, for example. Accordingly, a transactor or a consumer can access such information with a simple communication device. Further, the information can easily be rewritten and erased, for example, by a producer, but cannot be rewritten and erased, for example, by the transactor or the consumer.

Figure 10D:
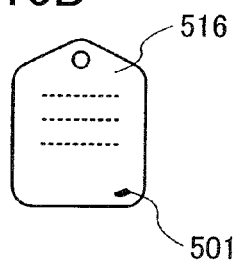
Figure 10E:
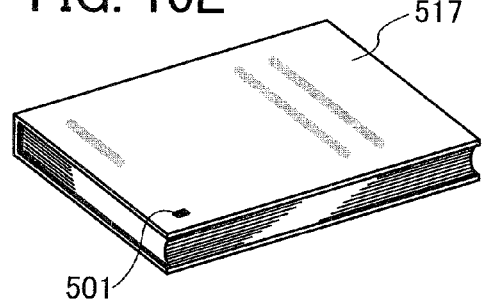

FIG. 10D illustrates a tag 516 formed by using paper or a film which is embedded with the RFID 501. The tag 516 is formed by using the paper or the film which is embedded with the RFID 501, whereby the tag can be manufactured less expensively than a conventional ID tag using a plastic housing. FIG. 10E illustrates a book 517 in which the RFID of the present invention is used for a cover of the book 517. The RFID 501 is embedded in the cover.

The label 514 or the tag 516 mounted with the RFID, which is an example of the semiconductor device of the present invention, is bonded to the product, whereby merchandise management becomes easy. For example, when the product is stolen, the perpetrator can be spotted quickly by following a route of the product. In such a manner, when the RFID of the present invention is used as an ID tag, historical management of the product's raw material, area of production, manufacturing and processing, distribution, sales, and the like as well as tracking inquiry becomes possible. That is, the product can be traceable. Moreover, by the present invention, a tracing management system of the product can be obtained at lower cost than before.

The RFID, which is an example of the semiconductor device of the present invention, is not easily damaged by local pressing force. Accordingly, a paper medium and a film medium each including the RFID, which is an example of the semiconductor device of the present invention, can be bent in process of attachment, setting, or the like, leading to improvement in work efficiency. Further, since information can be written with a writing material to a paper medium and a film medium each including the RFID, which is an example of the semiconductor device of the present invention, the range of uses of the RFID is expanded.

Embodiment Mode 4

In this embodiment mode, an electronic device provided with the RFID in Embodiment Mode 3 is described below.

Examples of electronic devices provided with the RFID in Embodiment Mode 3 include cameras such as video cameras and digital cameras, goggle displays (head mounted displays), navigation systems, audio reproducing devices (e.g., car audio and audio component sets), computers, game machines, portable information terminals (e.g., mobile computers, mobile phones, portable game machines, and e-book readers), and image reproducing devices provided with storage media (specifically, a device for reproducing the content of a storage medium such as a DVD (digital versatile disc) and having a display for displaying the reproduced image). FIGS. 11A to 11E illustrate specific examples of such electronic devices.

Figure 11A:
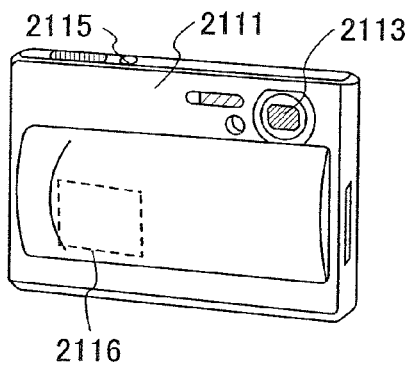
FIGS. 11A to 11E each illustrate an electronic device to which a semiconductor device of the present invention can be applied.
Figure 11B:
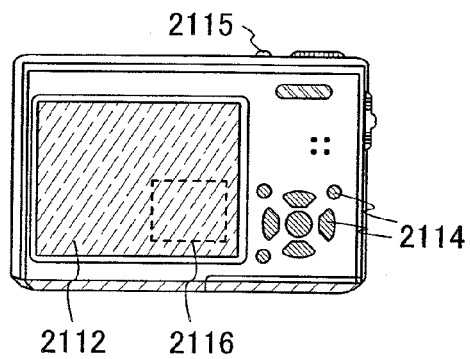

FIGS. 11A and 11B illustrate a digital camera. FIG. 11B illustrates the rear side of the digital camera in FIG. 11A. The digital camera includes a housing 2111, a display portion 2112, a lens 2113, operating keys 2114, a shutter button 2115, and the like. A semiconductor device 2116 of the present invention, which has a function as a memory device, an MPU, an image sensor, or the like, is provided inside the housing 2111.

Figure 11C:
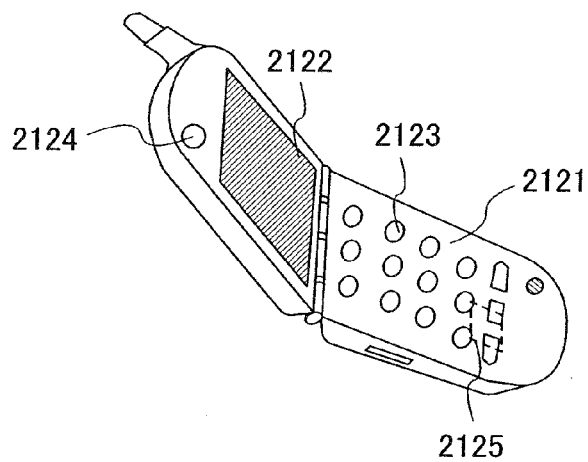

FIG. 11C illustrates a mobile phone, which is one typical example of portable terminals. The mobile phone includes a housing 2121, a display portion 2122, operating keys 2123, an optical sensor 2124, and the like. A semiconductor device 2125 of the present invention, which has a function as a memory device, an MPU, an image sensor, or the like, is provided inside the mobile phone.

Figure 11D:
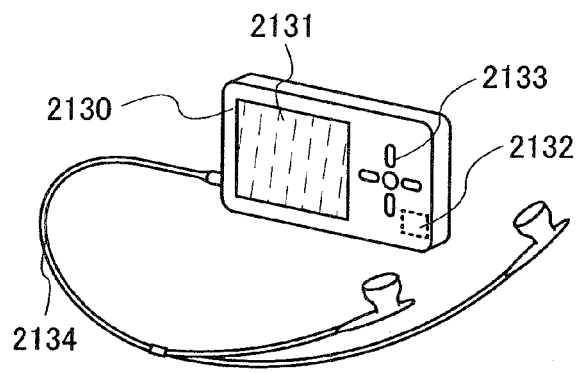

FIG. 11D illustrates a digital player, which is one typical example of audio devices. The digital player shown in FIG. 11D includes a main body 2130, a display portion 2131, a semiconductor device 2132 of the present invention, which has a function as a memory device, an MPU, an image sensor, or the like, an operation portion 2133, earphones 2134, and the like.

Figure 11E:
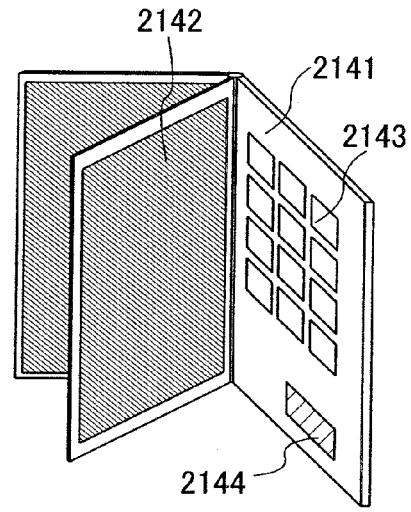

FIG. 11E illustrates an e-book reader (also referred to as electronic paper). The e-book reader includes a main body 2141, a display portion 2142, operating keys 2143, and a semiconductor device 2144 of the present invention, which has a function as a memory device, an MPU, an image sensor, or the like. Further, a modem may be incorporated in the main body 2141, or a structure capable of wirelessly transmitting and receiving information may be employed.

As described above, the applicable range of the semiconductor device of the present invention is so wide that the semiconductor device can be applied to other electronic devices.

Embodiment Mode 5

In this embodiment mode, a semiconductor device having a structure different from the structures in Embodiment Modes 1 and 2 is described. Moreover, a semiconductor device in this embodiment mode can also be applied to Embodiment Modes 3 and 4.

The semiconductor device in this embodiment mode and a manufacturing method thereof are described with reference to FIGS. 12A to 12D, FIGS. 13A to 13E, FIGS. 14A to 14C, FIGS. 15A and 15B, FIGS. 16A and 16B, FIG. 17, FIGS. 18A and 18B, FIG. 19, FIGS. 20A and 20B, FIG. 21, FIGS. 22A and 22B, FIG. 23, and FIG. 24.

Figure 12A:
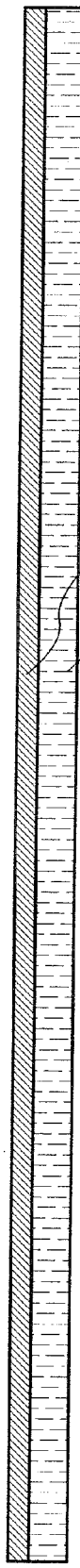
FIGS. 12A to 12D are cross-sectional views illustrating a method of manufacturing a semiconductor device of the present invention.
Figure 12B:

First, an insulating film 602 and a base film 603 including a lower base film 603a and an upper base film 603b are formed (see FIG. 12B) over a substrate 600 including a separation layer 601 (see FIG. 12A).

A material similar to the substrate 301 may used for the substrate 600. A material similar to the separation layer 302 may be used for the separation layer 601. In this embodiment mode, a glass substrate is used as the substrate 600, and a tungsten layer is used as the separation layer 601.

The insulating film 602 may be one of a silicon oxide film, a silicon oxide film containing nitrogen, a silicon nitride film, and a silicon nitride film containing oxygen; or a stacked layer of two or more of the above films. In this embodiment mode, a silicon oxide film containing nitrogen is formed as the insulating film 602.

As the base film 603, a stacked layer formed with two or more of a silicon oxide film, a silicon oxide film containing nitrogen, a silicon nitride film, and a silicon nitride film containing oxygen is used. In this embodiment mode, a silicon nitride film containing oxygen is formed as the lower base film 603a, and a silicon oxide film containing nitrogen is formed as the upper base film 603b.

Figure 12C:
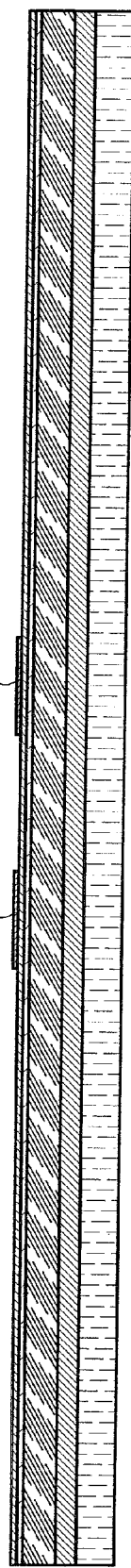

Next, a semiconductor film is formed over the base film 603 and is etched to form an island-shaped semiconductor film 611 and an island-shaped semiconductor film 612 (see FIG. 12C).

Figure 12D:
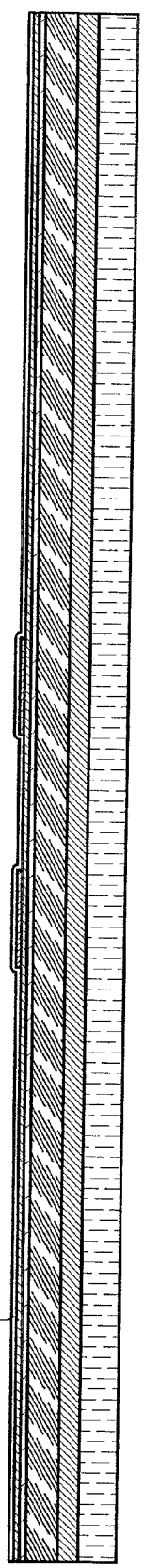

Then, a gate insulating film 607 is formed to cover the base film 603 and the island-shaped semiconductor films 611 and 612 (see FIG. 12D).

As the gate insulating film 607, one of a silicon oxide film, a silicon oxide film containing nitrogen, a silicon nitride film, and a silicon nitride film containing oxygen; or a stacked layer of two or more of the above films may be used. In this embodiment mode, a silicon oxide film containing nitrogen is formed as the gate insulating film 607.

A gate electrode 613 is formed over the island-shaped semiconductor film 611 with the gate insulating film 607 interposed therebetween, and a gate electrode 614 is formed over the island-shaped semiconductor film 612 with the gate insulating film 607 interposed therebetween. In this embodiment mode, a stacked layer of a tantalum nitride film and a tungsten film is used for the gate electrodes 613 and 614.

Next, an impurity element imparting one conductivity type is added to each of the island-shaped semiconductor films 611 and 612 using the gate electrodes 613 and 614 as masks, whereby a channel formation region, a source region, and a drain region are formed in each of the island-shaped semiconductor films 611 and 612.

As the impurity element imparting one conductivity type, phosphorus (P) or arsenic (As) may be used in the case of an impurity element imparting n-type conductivity, and boron (B) may be used in the case of an impurity element imparting p-type conductivity.

An impurity element imparting the same conductivity type may be added to each of the island-shaped semiconductor films 611 and 612, or an impurity element imparting a different conductivity type may be added to each of the island-shaped semiconductor films 611 and 612.

Next, a passivation film 608 is formed to cover the base film 603, the gate insulating film 607, and the gate electrodes 613 and 614 (see FIG. 13A). As the passivation film 608, one of a silicon oxide film, a silicon oxide film containing nitrogen, a silicon nitride film, and a silicon nitride film containing oxygen; or a stacked layer of two or more of the above films may be used. In this embodiment mode, a silicon oxide film containing nitrogen is formed as the passivation film 608.

Then, the base film 603, the gate insulating film 607, and the passivation film 608 are etched (see FIG. 13B).

Next, an interlayer insulating film 609 is formed to cover the base film 603, the gate insulating film 607, and the passivation film 608 which have been etched (see FIG. 13C). In this embodiment mode, a silicon nitride film containing oxygen is formed as the interlayer insulating film 609.

Then, an interlayer insulating film 616 is formed over the interlayer insulating film 609 (see FIG. 13D). In this embodiment mode, a silicon oxide film containing nitrogen is formed as the interlayer insulating film 616.

Over the interlayer insulating film 616, an electrode 621 which is electrically connected to one of the source region and the drain region of the island-shaped semiconductor film 611, an electrode 622 which is electrically connected to the gate electrode 613, and an electrode 623 which is electrically connected to the other of the source region and the drain region of the island-shaped semiconductor film 611 are formed. Further, over the interlayer insulating film 616, an electrode 625 which is electrically connected to one of the source region and the drain region of the island-shaped semiconductor film 612, an electrode 626 which is electrically connected to the gate electrode 614, and an electrode 627 which is electrically connected to the other of the source region and the drain region of the island-shaped semiconductor film 612 are formed (see FIG. 13D). Accordingly, thin film transistors (TFTs) are formed.

Note that in this embodiment mode, the electrodes 621 to 623 and 625 to 627 are formed using a stacked layer of three films of a titanium film, an aluminum film, and a titanium film.

Then, the substrate 600 and the entire stacked-layer structure over the substrate 600 are heated, hydrogen is released from the interlayer insulating film 609, the island-shaped semiconductor films 611 and 612 are hydrogenated, and thus, dangling bonds in the island-shaped semiconductor films 611 and 612 are terminated.

Figure 14A:
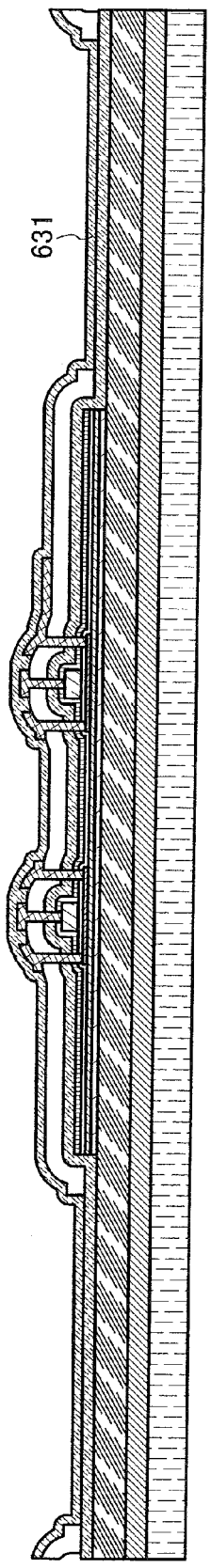
FIGS. 14A to 14C are cross-sectional views illustrating a method of manufacturing a semiconductor device of the present invention.

Next, an interlayer insulating film 631 formed of a silicon nitride film is formed to cover the interlayer insulating films 609 and 616 and the electrodes 621 to 623 and 625 to 627 (see FIG. 14A).

Figure 14B:
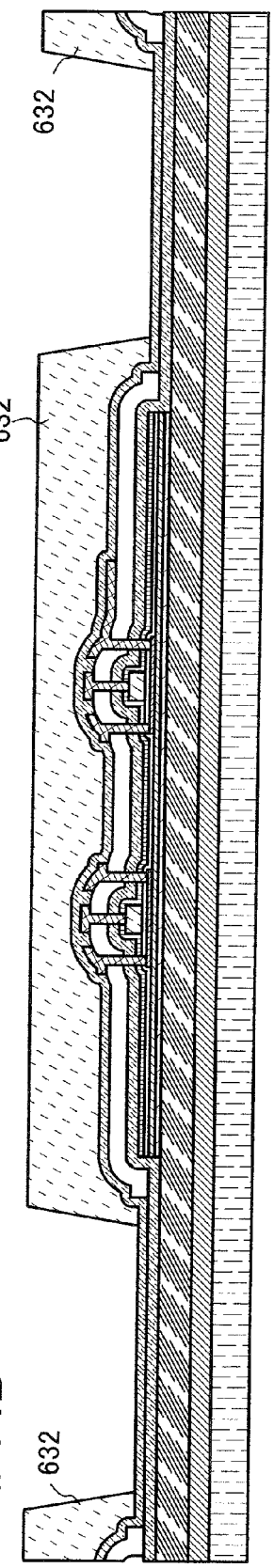

Then, an interlayer insulating film 632 is formed with an organic resin (see FIG. 14B). In this embodiment mode, polyimide is used as a material of the interlayer insulating film 632. In FIG. 14B, the interlayer insulating film 632 has an opening portion in a region where the interlayer insulating film 616 or the base film 603 is not formed. The opening portion is formed by etching of the interlayer insulating film 632. It is acceptable as long as the opening portion is formed before a passivation film 636 described later is formed, and the interlayer insulating film 632 is not necessarily etched in the step of FIG. 14B.

Figure 14C:
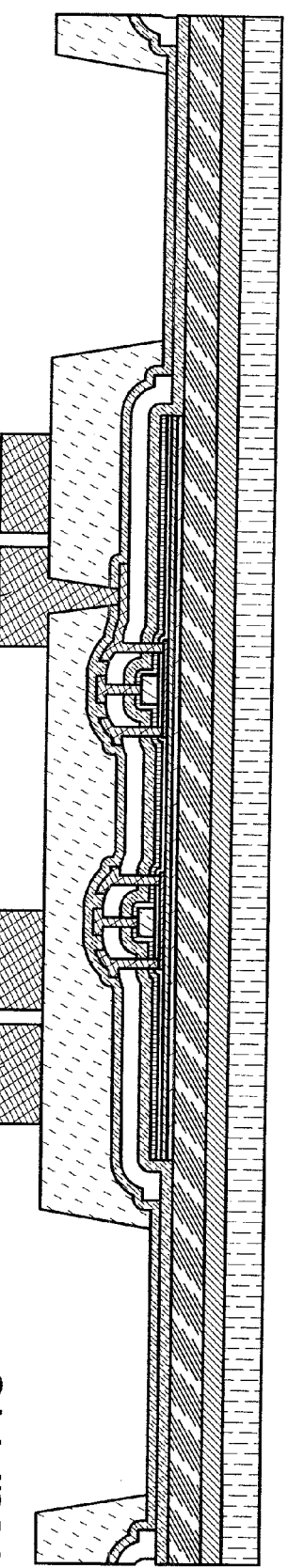

An antenna 635 which is electrically connected to the electrode 627 is formed over the interlayer insulating film 632 (see FIG. 14C). In this embodiment mode, the antenna 635 is formed with a stacked layer of a titanium film and an aluminum film.

Figure 25A:
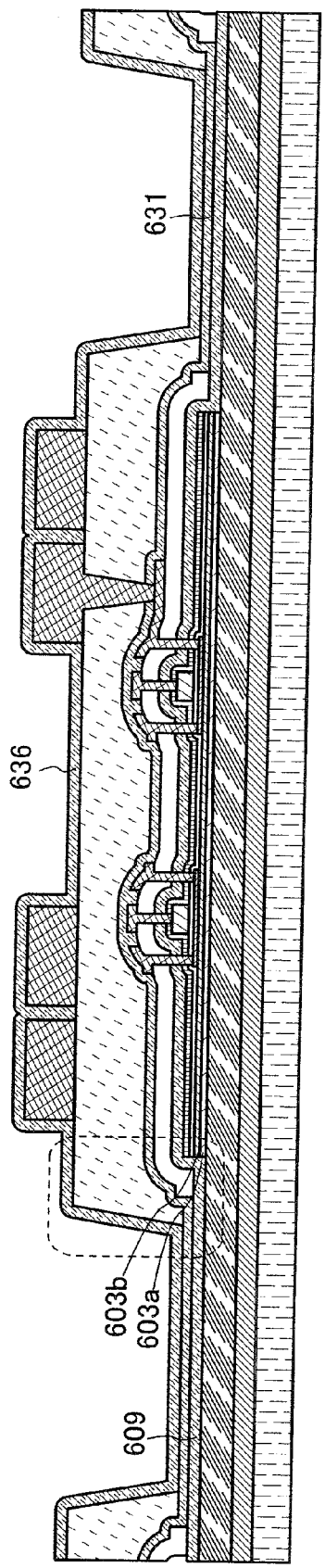
FIGS. 25A to 25C are cross-sectional views each illustrating a method of manufacturing a semiconductor device of the present invention.
Figure 25B:
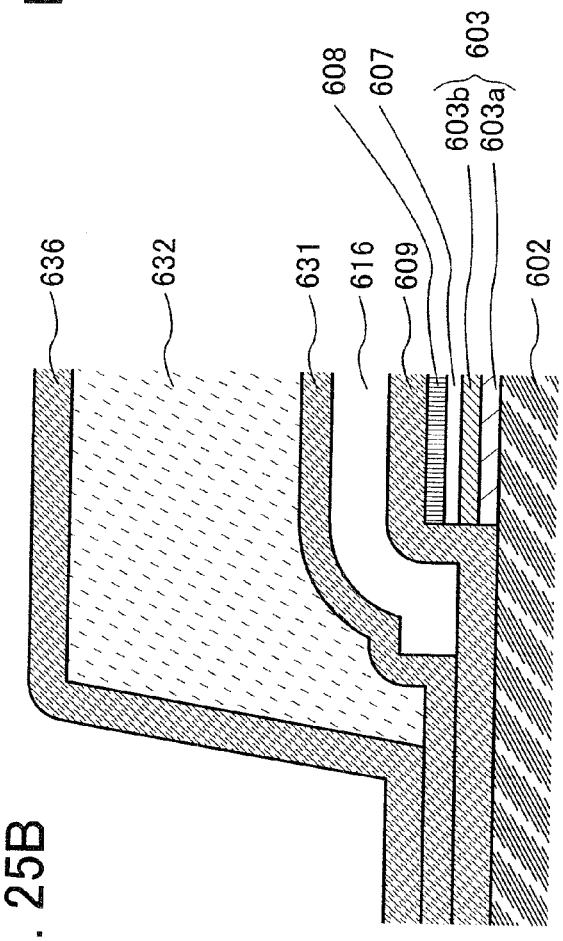
Figure 25C:
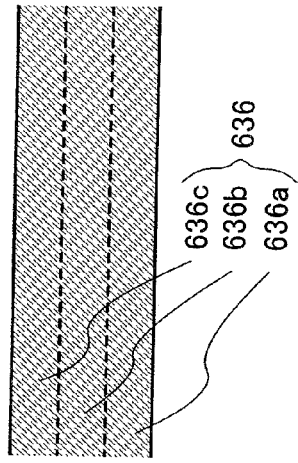

Next, the passivation film 636 is formed to cover the interlayer insulating films 631 and 632 and the antenna 635 (see FIG. 15A). Note that FIG. 25A is the same as FIG. 15A. FIG. 25B is an enlarged view of a portion surrounded by dotted lines in FIG. 25A. FIG. 25C is an enlarged view of a part of the passivation film 636.

The passivation film 636 is a stacked layer of a lower passivation film 636a, a middle passivation film 636b, and an upper passivation film 636c (see FIG. 25C). In this embodiment mode, a silicon nitride film is formed as the lower passivation film 636a, an amorphous silicon film is formed as the middle passivation film 636b, and a silicon nitride film is formed as the upper passivation film 636c. An impurity element imparting conductivity may be or may not be added to the amorphous silicon film of the middle passivation film 636b. As the impurity element imparting conductivity, phosphorus (P) or arsenic (As) may be used as the impurity element imparting n-type conductivity, and boron (B) may be used as the impurity element imparting p-type conductivity.

An amorphous silicon film having conductivity is used as the middle passivation film 636b, whereby electrostatic discharge occurring in the element can be prevented.

Note that the upper passivation film 636c is not necessarily formed.

Although the interlayer insulating films 609 and 631 and the passivation film 636 are all formed so far, any of these films is not necessarily formed as appropriate.

FIG. 15B illustrates an example in which the interlayer insulating film 609 is not formed. FIG. 16A illustrates an example in which the passivation film 636 is not formed. FIG. 16B illustrates an example in which the interlayer insulating film 631 is not formed.

Figure 17:
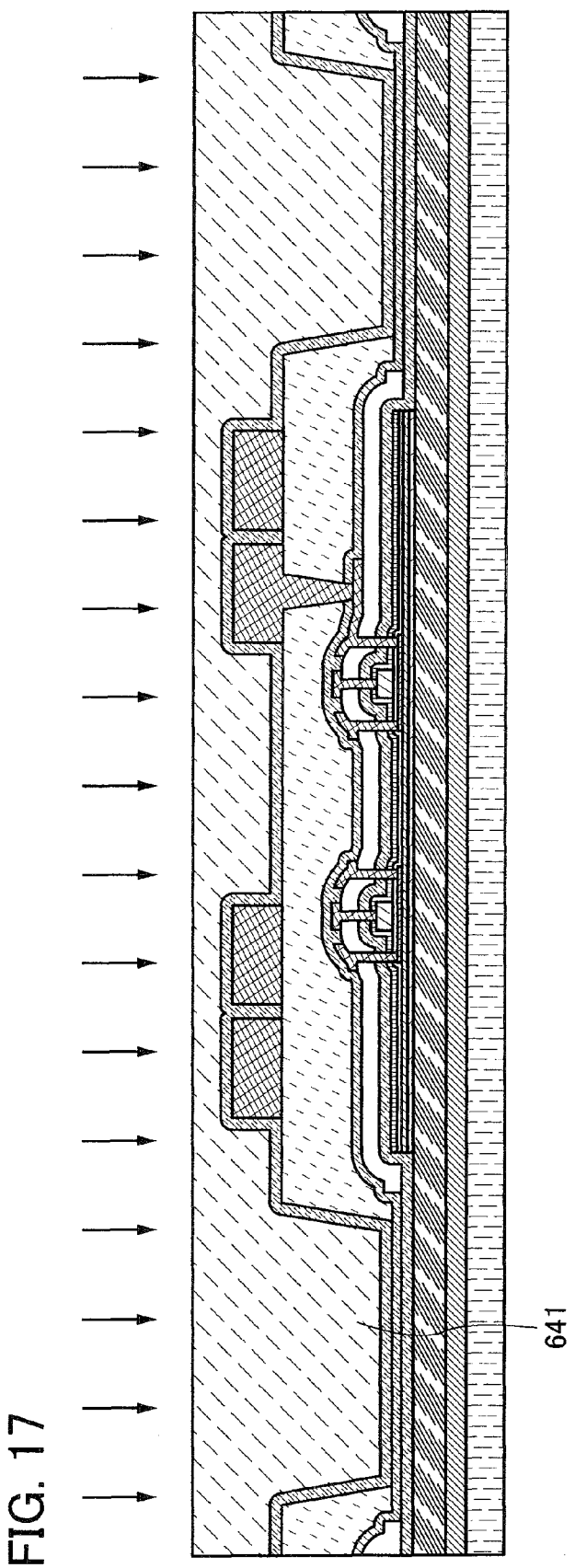
FIG. 17 is a cross-sectional view illustrating a method of manufacturing a semiconductor device of the present invention.

When any of the stacked-layer structures shown in FIGS. 15A and 15B and FIGS. 16A and 16B is obtained, a sealing layer 641 including a fiber and an organic resin layer is bonded over the antenna 635, the interlayer insulating films 631 and 632, and the passivation film 636 by pressing (see FIG. 17).

The sealing layer 641 is similar to the sealing layer 305 or the like. The fiber included in the sealing layer 641 is similar to the fiber 113. The organic resin layer included in the sealing layer 641 is similar to the organic resin layer 114.

Next, an adhesive tape 642 which can be separated by light or heat is provided over the sealing layer 641. Then, the separation layer 601 is separated while a roller 645 rotates on the adhesive tape 642 (see FIG. 18A), so that the substrate 600 is separated (see FIG. 18B).

At this time, when grooves reaching the separation layer 601 of the substrate 600 are formed and a liquid is dropped into the groove in a manner similar to FIG. 1E, separation is more easily performed.

Figure 19:
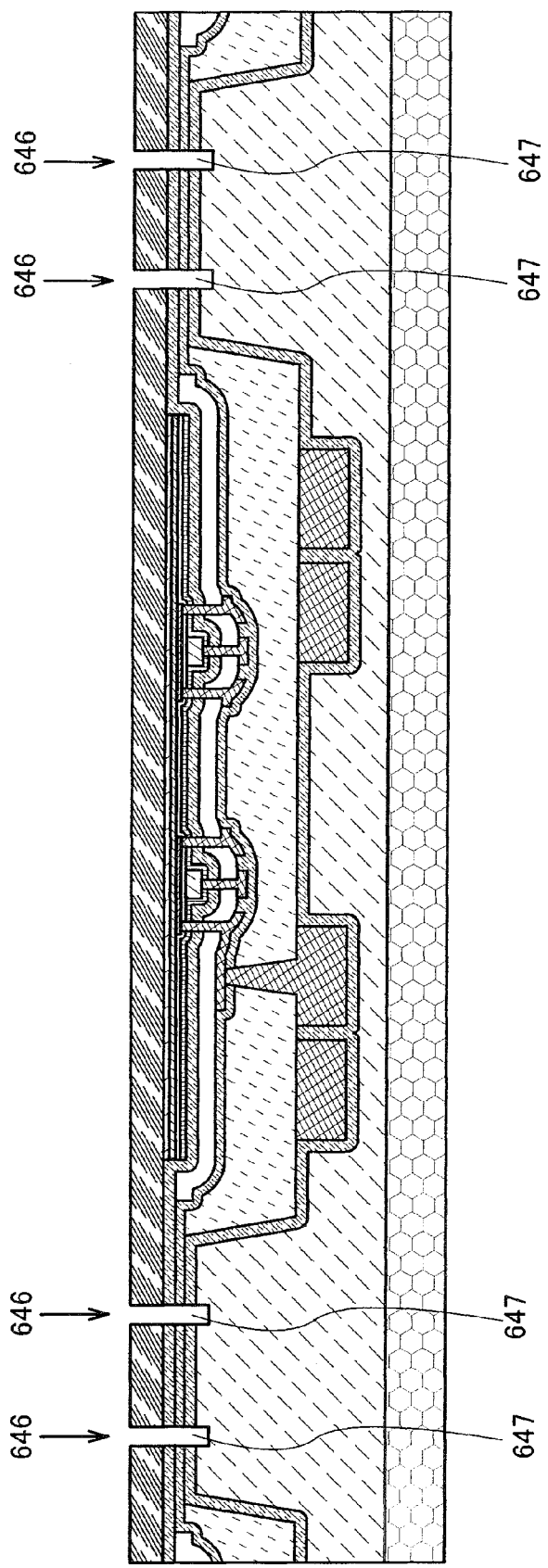
FIG. 19 is a cross-sectional view illustrating a method of manufacturing a semiconductor device of the present invention.

Next, a laser beam 646 is emitted from the side where the insulating film 602 is formed, and grooves 647 are formed in parts of the insulating film 602, the interlayer insulating films 609 and 631, the passivation film 636, and the sealing layer 641 (see FIG. 19). Note that the adhesive tape 642 may be separated before or after the groove 647 is formed.

Then, a sealing layer 651 including a fiber and an organic resin layer is bonded so as to be in contact with the insulating film 602 by pressing (see FIG. 20A). Accordingly, the organic resin in the sealing layer 651 enters the groove 647.

Figure 21:
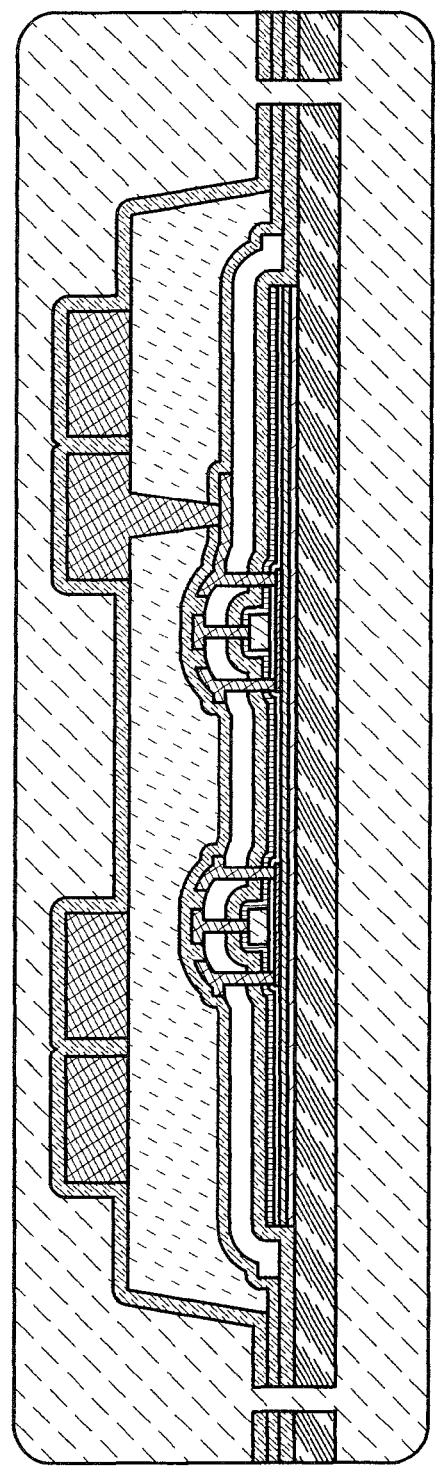
FIG. 21 is a cross-sectional view illustrating a method of manufacturing a semiconductor device of the present invention.
Figure 22A:
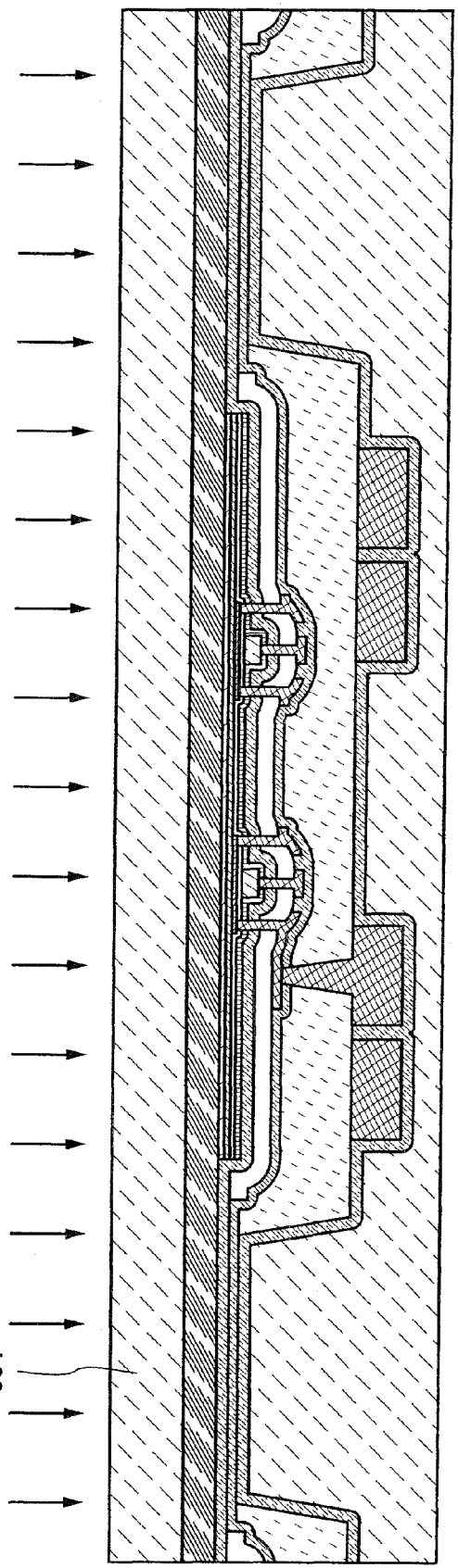
FIGS. 22A and 22B are cross-sectional views illustrating a method of manufacturing a semiconductor device of the present invention.
Figure 22B:
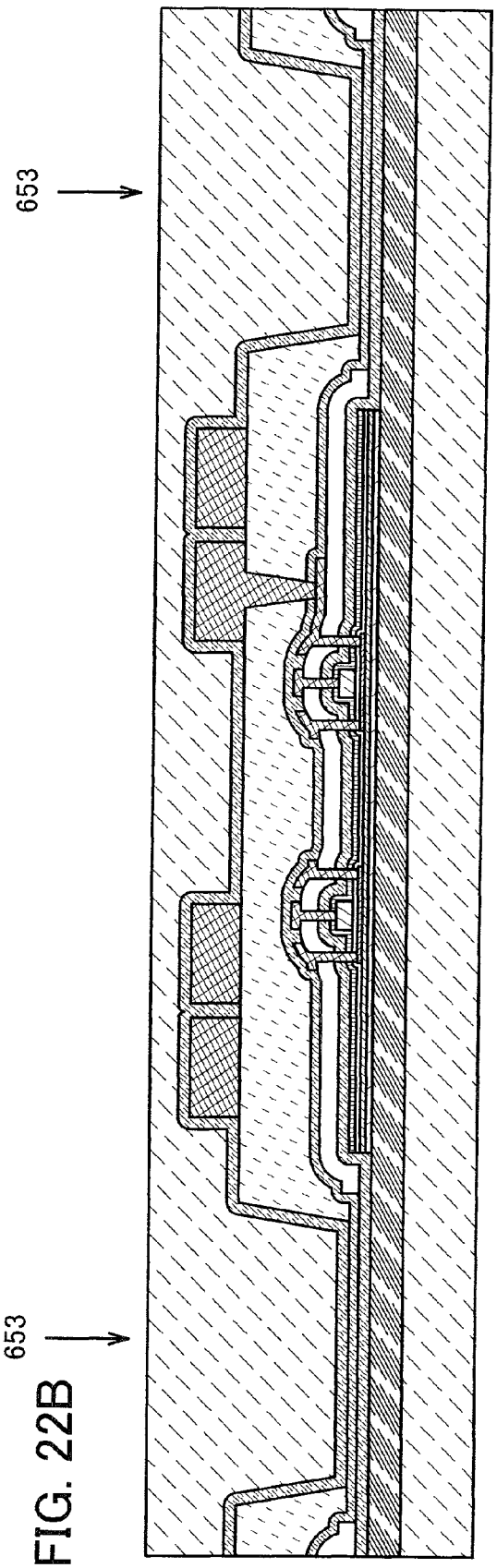

Further, a laser beam 653 is emitted to a region between the adjacent grooves 647 which are provided in a region between elements (see FIG. 20B), and a chip is cut out (see FIG. 21).

In addition, an example in which the groove 647 is not formed is shown below. First, when the stacked-layer structure shown in FIG. 18B is obtained, the sealing layer 651 including the fiber and the organic resin layer is provided in contact with the insulating film 602 and bonded by pressing (see FIG. 22A).

Figure 23:
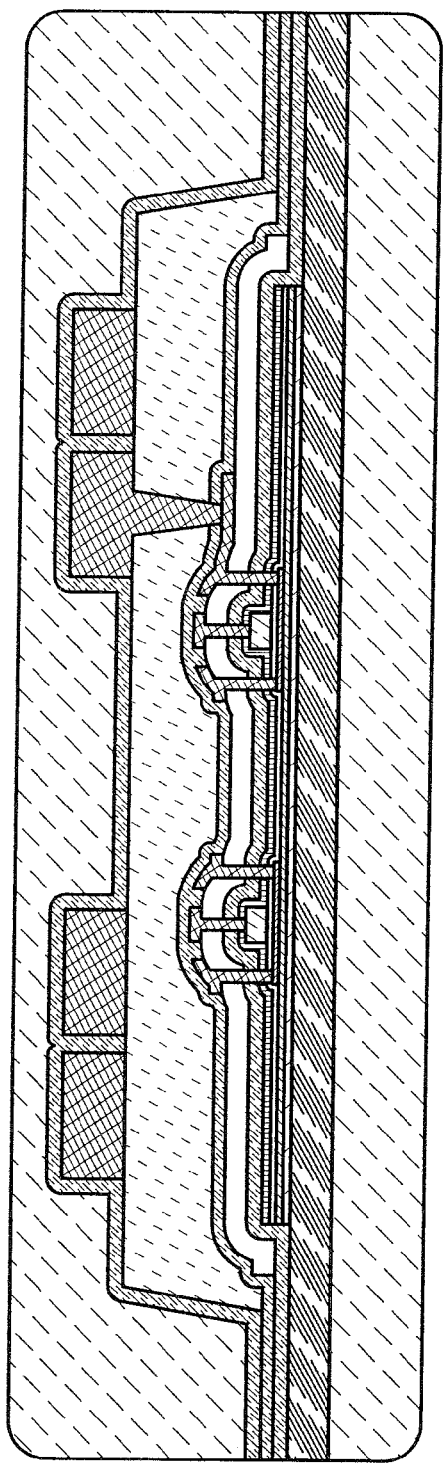
FIG. 23 is a cross-sectional view illustrating a method of manufacturing a semiconductor device of the present invention.

Further, the laser beam 653 is emitted to a region between elements (see FIG. 22B), and a chip is cut out (see FIG. 23).

Figure 24:
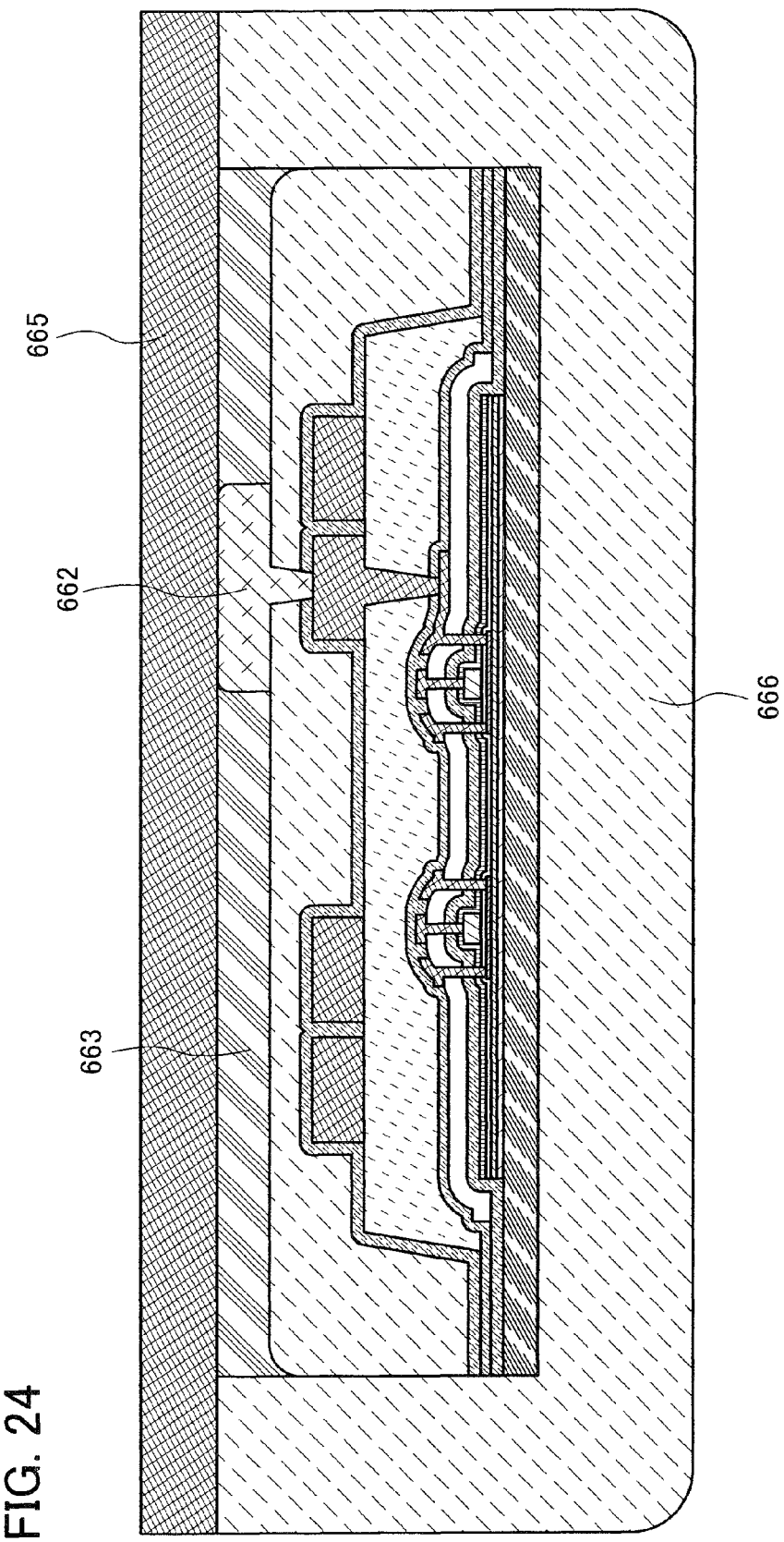
FIG. 24 is a cross-sectional view illustrating a method of manufacturing a semiconductor device of the present invention.

A semiconductor device shown in FIG. 24 is formed in the following steps. That is, when the stacked-layer structure shown in FIG. 18B is obtained, the adhesive tape 642 is separated. Next, the laser beam 653 is emitted to a region between elements, and a chip is cut out.

Further, an electrode 662 which is electrically connected to the antenna 635 is formed by using a conductive adhesive material, over the sealing layer 641. An adhesive material 663 is formed in a region over the sealing layer 651, which is not provided with the electrode 662.

The chip is bonded to an antenna 665 with the use of the adhesive material 663 and the electrode 662 formed using the conductive adhesive material. Next, a sealing layer 666 including a fiber and an organic resin layer is bonded to surround the antenna 665 and the chip (see FIG. 24).

In this embodiment mode, the interlayer insulating film 631 formed by using a silicon nitride film and the passivation film 636 are formed, whereby impurity contamination can be suppressed, and stress to bending can be relaxed. Accordingly, a semiconductor device with high reliability can be obtained.

Moreover, a TFT can be surrounded by the lower base film 603a, the upper base film 603b, and the interlayer insulating film 609, whereby impurity contamination can be further suppressed, and a semiconductor device with higher reliability can be obtained.

This application is based on Japanese Patent Application serial No. 2007-232713 filed with Japan Patent Office on Sep. 7, 2007, the entire contents of which are hereby incorporated by reference.

REFERENCE NUMERALS

41: interlayer insulating film, 42: interlayer insulating film, 43: interlayer insulating film, 51: element layer, 52a: thin film transistor, 52b: thin film transistor, 53a: semiconductor layer, 53b: semiconductor layer, 54: gate insulating layer, 55a: gate electrode, 55b: gate electrode, 56: insulating layer, 57a: wiring, 57b: wiring, 58a: wiring, 58b: wiring, 61: element layer, 62: memory element, 63: floating gate electrode, 64: tunnel insulating layer, 65: control insulating layer, 71: element layer, 72: diode, 73: light receiving portion, 74: electrode, 81: element layer, 82: wiring, 83: electrode, 113: fiber, 113a: warp yarn, 113b: weft yarn, 113c: basket hole, 114: organic resin layer, 301: substrate, 302: separation layer, 303: semiconductor element layer, 304: conductive resin, 305: sealing layer, 306: groove, 307: roller, 312: opening portion, 313: laser beam, 314: groove, 315: conductive adhesive material, 316: adhesive material, 317: antenna, 318: substrate, 321: chip, 323: sealing layer, 324: fiber, 325: organic resin layer, 411: antenna, 412: circuit portion, 460: power supply portion, 461: signal processing portion, 462: rectifier circuit, 463: storage capacitor, 464: demodulation circuit, 465: clock generation/correction circuit, 466: recognition/determination circuit, 467: memory controller, 468: mask ROM, 469: encoding circuit, 470: modulation circuit, 501: RFID, 511: bearer bond, 512: certificate, 513: label base (separate paper), 514: label, 515: box, 516: tag, 517: book, 600: substrate, 601: separation layer, 602: insulating film, 603: base film, 603a: lower base film, 603b: upper base film, 607: gate insulating film, 608: passivation film, 609: interlayer insulating film, 611: island-shaped semiconductor film, 612: island-shaped semiconductor film, 613: gate electrode, 614: gate electrode, 616: interlayer insulating film, 621: electrode, 622: electrode, 623: electrode, 625: electrode, 626: electrode, 627: electrode, 631: interlayer insulating film, 632: interlayer insulating film, 635: antenna, 636: passivation film, 636a: lower passivation film, 636b: middle passivation film, 636c: upper passivation film, 641: sealing layer, 642, adhesive tape, 645: roller, 646: laser beam, 647: groove, 651: sealing layer, 653: laser beam, 662: electrode, 663: adhesive material, 665: antenna, 666: sealing layer, 2111: housing, 2112: display portion, 2113: lens, 2114: operating key, 2115: shutter button, 2116: semiconductor device, 2121: housing, 2122: display portion, 2123: operating key, 2124: optical sensor, 2125: semiconductor device, 2130: main body, 2131: display portion, 2132: semiconductor device, 2133: operation portion, 2134: earphone, 2141: main body, 2142: display portion, 2143: operating key, 2144: semiconductor device

The invention claimed is:

1. A method for manufacturing a semiconductor device, comprising the steps of:
   forming a separation layer and a semiconductor element layer including a thin film transistor over a substrate;

forming a conductive resin electrically connected to the semiconductor element layer;

forming a first sealing layer including a first fiber and a first organic resin layer over the semiconductor element layer and the conductive resin;

forming a groove in the first sealing layer, the semiconductor element layer, and the separation layer;

dropping a liquid into the groove to separate the separation layer and the semiconductor element layer from each other;

removing a portion of the first sealing layer over the conductive resin to form an opening portion;

dividing a set of the first sealing layer and the semiconductor element layer into a chip;

bonding the chip to a conductive film; and forming a second sealing layer including a second fiber and a second organic resin layer so as to cover the conductive film and the chip, wherein the semiconductor element layer is formed over the separation layer, and wherein the portion of the first sealing layer is overlapped with the conductive resin.

2. The method for manufacturing a semiconductor device according to claim 1, wherein in the first fiber and the second fiber, warp yarns and weft yarns in each of which a plurality of single yarns of one of an organic compound and an inorganic compound are bundled are closely woven.

3. The method for manufacturing a semiconductor device according to claim 1, wherein each of the first fiber and the second fiber is one of a woven fabric and a nonwoven fabric.

4. The method for manufacturing a semiconductor device according to claim 1, wherein each of the first fiber and the second fiber includes one of a polyvinyl alcohol fiber, a polyester fiber, a polyamide fiber, a polyethylene fiber, an aramid fiber, a polyparaphenylene benzobisoxazole fiber, a glass fiber, and a carbon fiber.

5. The method for manufacturing a semiconductor device according to claim 1, wherein each of the first and the second organic resin layers includes one of a thermosetting resin, a thermoplastic resin, and a UV curable resin.

6. The method for manufacturing a semiconductor device according to claim 5, wherein the thermosetting resin is one of an epoxy resin, an unsaturated polyester resin, a polyimide resin, a bismaleimide-triazine resin, and a cyanate resin.

7. The method for manufacturing a semiconductor device according to claim 5, wherein the thermoplastic resin is one of a polyphenylene oxide resin, a polyetherimide resin, and a fluorine resin.

8. The method for manufacturing a semiconductor device according to claim 1, wherein the conductive film includes at least one of silver (Ag), gold (Au), copper (Cu), nickel (Ni), platinum (Pt), palladium (Pd), tantalum (Ta), molybdenum (Mo), titanium (Ti), and aluminum (Al).

9. The method for manufacturing a semiconductor device according to claim 1, wherein the liquid contains one of water, alcohol, and carbonated water.

10. The method for manufacturing a semiconductor device according claim 1, wherein the opening portion is formed by removing the first sealing layer over the conductive resin by laser beam irradiation.

11. The method for manufacturing a semiconductor device according to claim 10, wherein the laser beam is in one of an ultraviolet region, a visible light region, and an infrared region.

12. The method for manufacturing a semiconductor device according to claim 1, wherein the conductive film is an antenna formed over a base material.

13. A method for manufacturing a semiconductor device, comprising the steps of:

forming a separation layer over a substrate;

forming a semiconductor element layer over the separation layer;

forming a conductive resin electrically connected to the semiconductor element layer;

forming a first sealing layer over the semiconductor element layer and the conductive resin, the first sealing layer including a first fiber and a first organic resin layer;

separating the substrate from the semiconductor element layer;

removing a portion of the first sealing layer over the conductive resin to form an opening portion;

dividing a set of the first sealing layer and the semiconductor element layer into a chip, the chip including a portion of the first sealing layer and a portion of the semiconductor element layer;

bonding the chip to a conductive film wherein the conductive film is in contact with the portion of the semiconductor element layer through the opening portion of the first sealing layer; and forming a second sealing layer so that the portion of the semiconductor element layer is located between the portion of the first sealing layer and the second sealing layer, the second sealing layer including a second fiber and a second organic resin layer.

14. The method for manufacturing a semiconductor device according to claim 13, wherein in the first fiber and the second fiber, warp yarns and weft yarns in each of which a plurality of single yarns of one of an organic compound and an inorganic compound are bundled are closely woven.

15. The method for manufacturing a semiconductor device according to claim 13, wherein each of the first fiber and the second fiber is one of a woven fabric and a nonwoven fabric.

16. The method for manufacturing a semiconductor device according to claim 13, wherein each of the first fiber and the second fiber includes one of a polyvinyl alcohol fiber, a polyester fiber, a polyamide fiber, a polyethylene fiber, an aramid fiber, a polyparaphenylene benzobisoxazole fiber, a glass fiber, and a carbon fiber.

17. The method for manufacturing a semiconductor device according to claim 13, wherein each of the first and the second organic resin layers includes one of a thermosetting resin, a thermoplastic resin, and a UV curable resin.

18. The method for manufacturing a semiconductor device according to claim 13, wherein the opening portion is formed by removing the first sealing layer over the conductive resin by laser beam irradiation.

19. The method for manufacturing a semiconductor device according to claim 13, wherein the conductive film is an antenna formed over a base material.

20. The method for manufacturing a semiconductor device according to claim 13,
wherein the semiconductor element layer includes a thin film transistor.

* * * * *

UNITED STATES PATENT AND TRADEMARK OFFICE
CERTIFICATE OF CORRECTION

| | | |
|---|---|---|
| PATENT NO. | : 8,459,561 B2 | Page 1 of 1 |
| APPLICATION NO. | : 12/204320 | |
| DATED | : June 11, 2013 | |
| INVENTOR(S) | : Aoki et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 604 days.

The following text should be added on page 2, Col. 1, line 3, under U.S. Patent Documents:

2005/0191448 A1*    9/2005    Suh et al.  ............... 428/32.69

Signed and Sealed this
Twenty-third Day of December, 2014

Michelle K. Lee
*Deputy Director of the United States Patent and Trademark Office*